(12) United States Patent
Tamura

(10) Patent No.: US 6,301,116 B1
(45) Date of Patent: Oct. 9, 2001

(54) AUXILIARY DEVICE FOR ELECTRONIC APPARATUS

(75) Inventor: Kenichi Tamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/895,595

(22) Filed: Jul. 16, 1997

(30) Foreign Application Priority Data

Jul. 19, 1996 (JP) .................................................... 8-207582

(51) Int. Cl.[7] ................................. H05K 7/16; H05K 5/02
(52) U.S. Cl. ....................... 361/727; 361/728; 361/732; 361/725; 364/708.1
(58) Field of Search ..................................... 361/730, 725, 361/728, 686, 727, 681, 682, 683, 680, 726, 741, 754, 756, 732; D6/396, 397; D14/100, 114; 70/33, 38 R; 364/708.1; 439/638, 928; 312/223.2

(56) References Cited

U.S. PATENT DOCUMENTS

| | | | |
|---|---|---|---|
| 3,824,472 | * | 7/1974 | Engel et al. ........................... 325/355 |
| 4,659,159 | * | 4/1987 | Takahashi .......................... 339/75 M |
| 5,192,222 | * | 3/1993 | Krause et al. ....................... 439/347 |
| 5,313,596 | * | 5/1994 | Swindler et al. ..................... 395/325 |
| 5,323,291 | * | 6/1994 | Boyle et al. .......................... 361/683 |
| 5,488,572 | * | 1/1996 | Belmont ............................ 364/514 R |
| 5,535,093 | * | 7/1996 | Noguchi et al. ....................... 361/686 |
| 5,784,253 | * | 7/1998 | Ooka et al. ........................... 361/686 |
| 5,910,933 | * | 6/1999 | Moore ..................................... 369/33 |
| 5,948,074 | * | 9/1999 | Ninomiya ................................ 710/2 |
| 5,974,026 | * | 10/1999 | Guerini ................................ 369/291 |
| 6,038,199 | * | 3/2000 | Pawlowski et al. .................... 369/25 |

* cited by examiner

*Primary Examiner*—Leo P. Picard
*Assistant Examiner*—Anatoly Vortman
(74) *Attorney, Agent, or Firm*—Jay H. Maioli

(57) ABSTRACT

An auxiliary device for an electronic apparatus which is connected to a portable electronic apparatus, such as a portable disc player to perform exchange of signals between it and the electronic apparatus, wherein the auxiliary device includes an attachment section, first and second detection mechanisms, an input/output section and a movement mechanism. The electronic apparatus is attached to the attachment section. The first and second detection mechanism are operated by the electronic apparatus attached to the attachment section. The holding mechanism holds the electronic apparatus attached to the attachment section. The holding mechanism holds the electronic apparatus when the first detection mechanism is operated by the electronic apparatus attached to the attachment section and then the second detection mechanism is operated by the electronic apparatus. The input/output section is connected to the connection terminal of the electronic apparatus held by the holding mechanism to perform exchange of signals. The movement mechanism causes the input/output section to move between a first position where it is connected to the connection terminal and a second position where it is separated from the connection terminal.

21 Claims, 19 Drawing Sheets

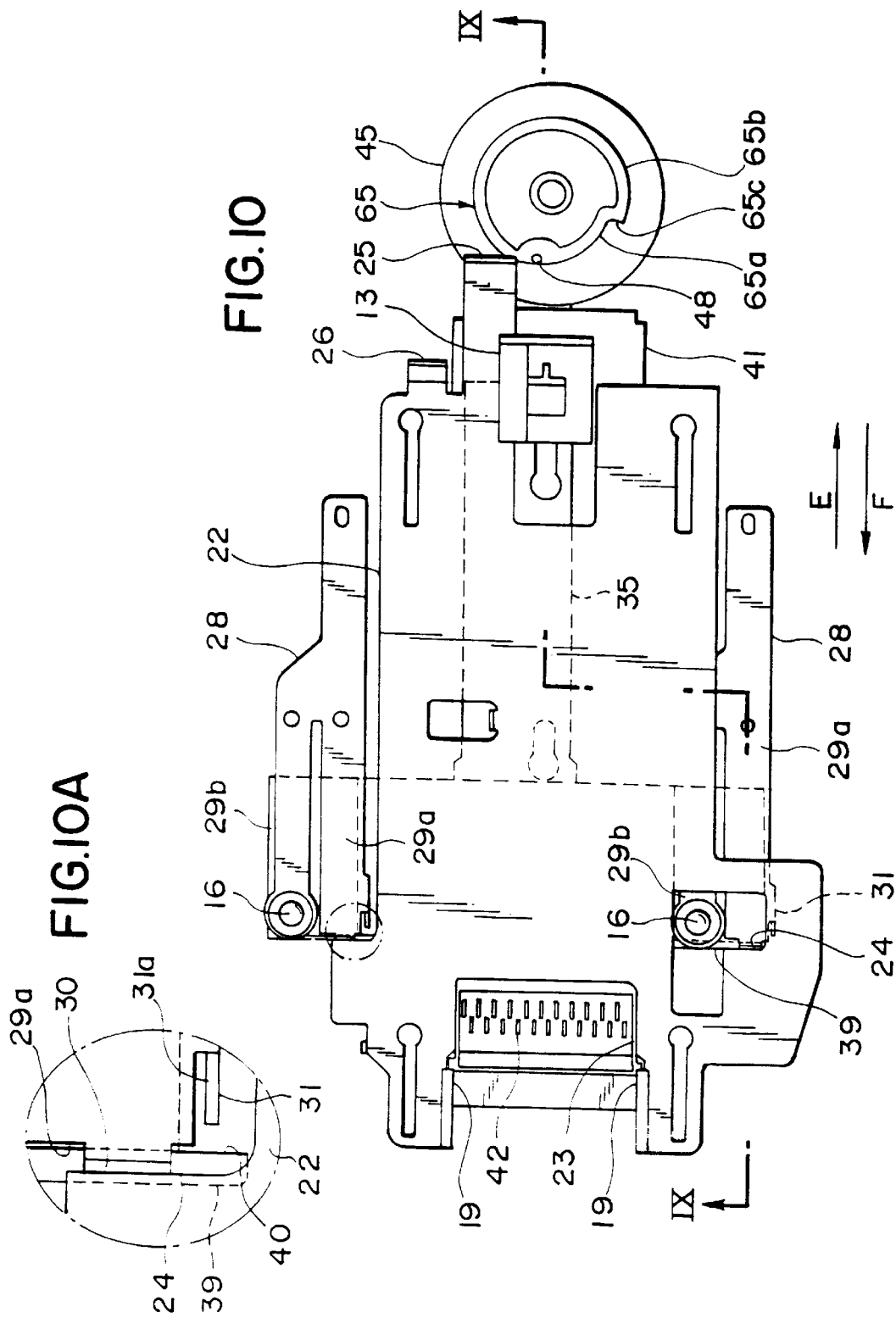

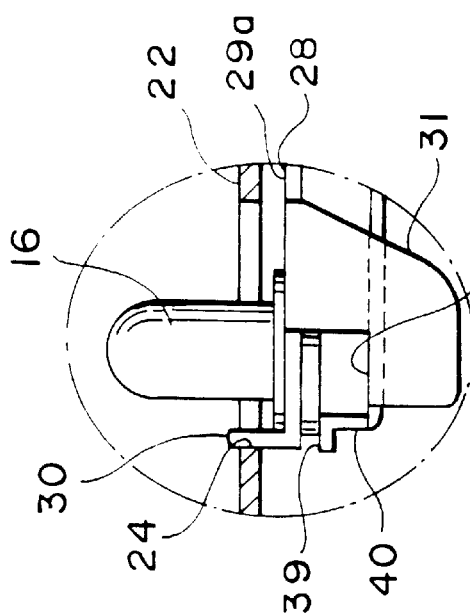
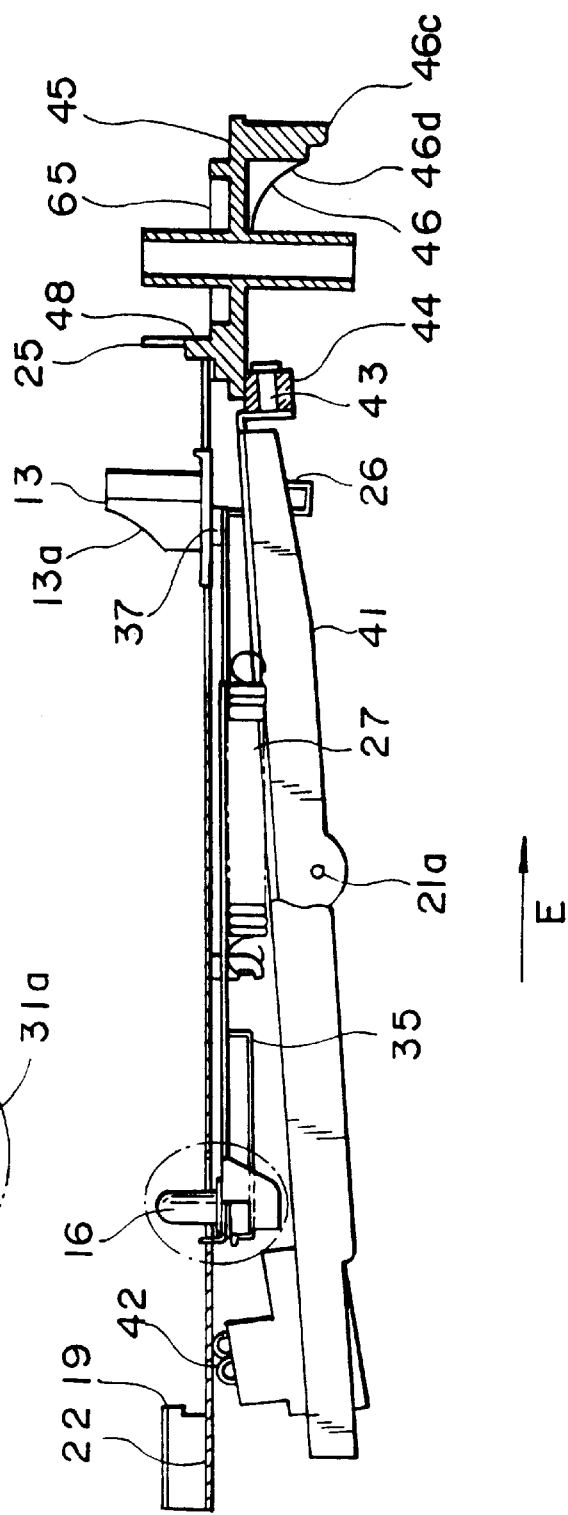

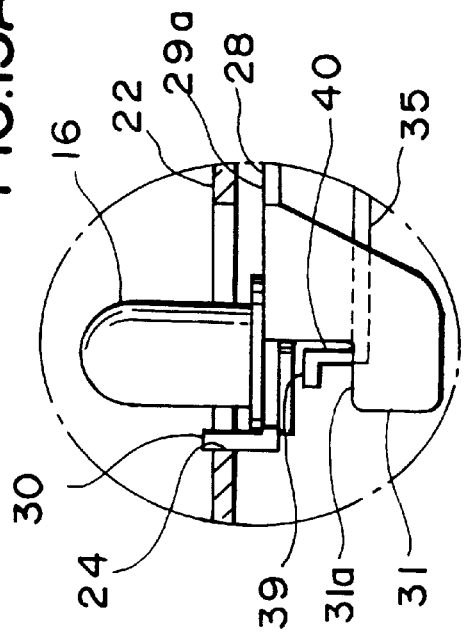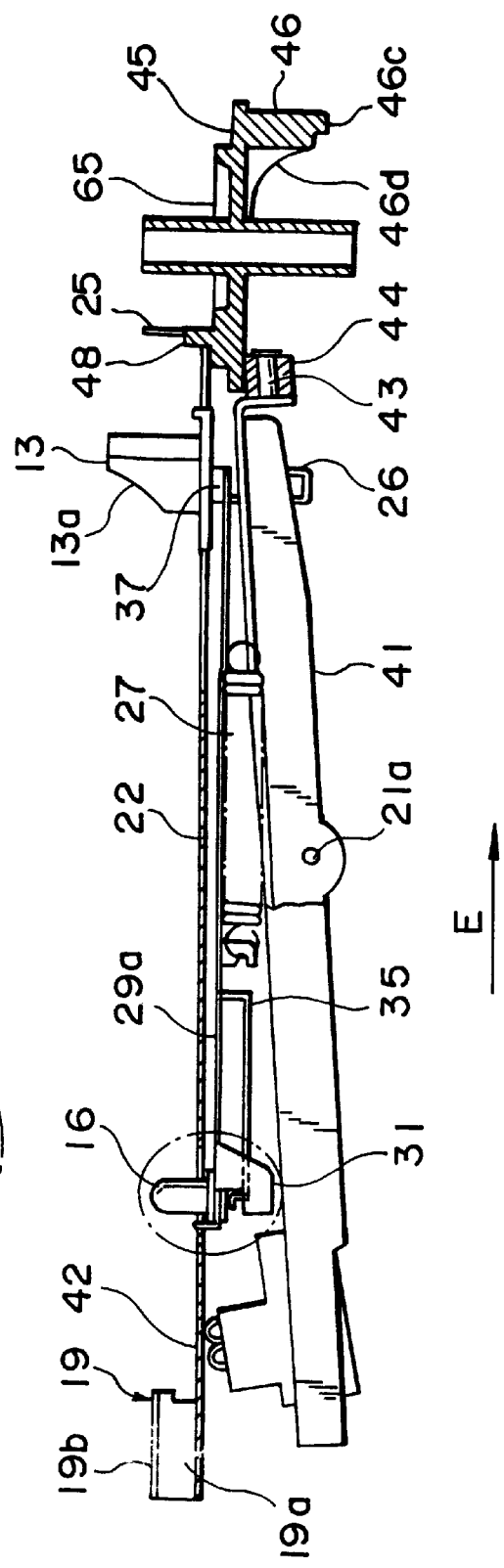

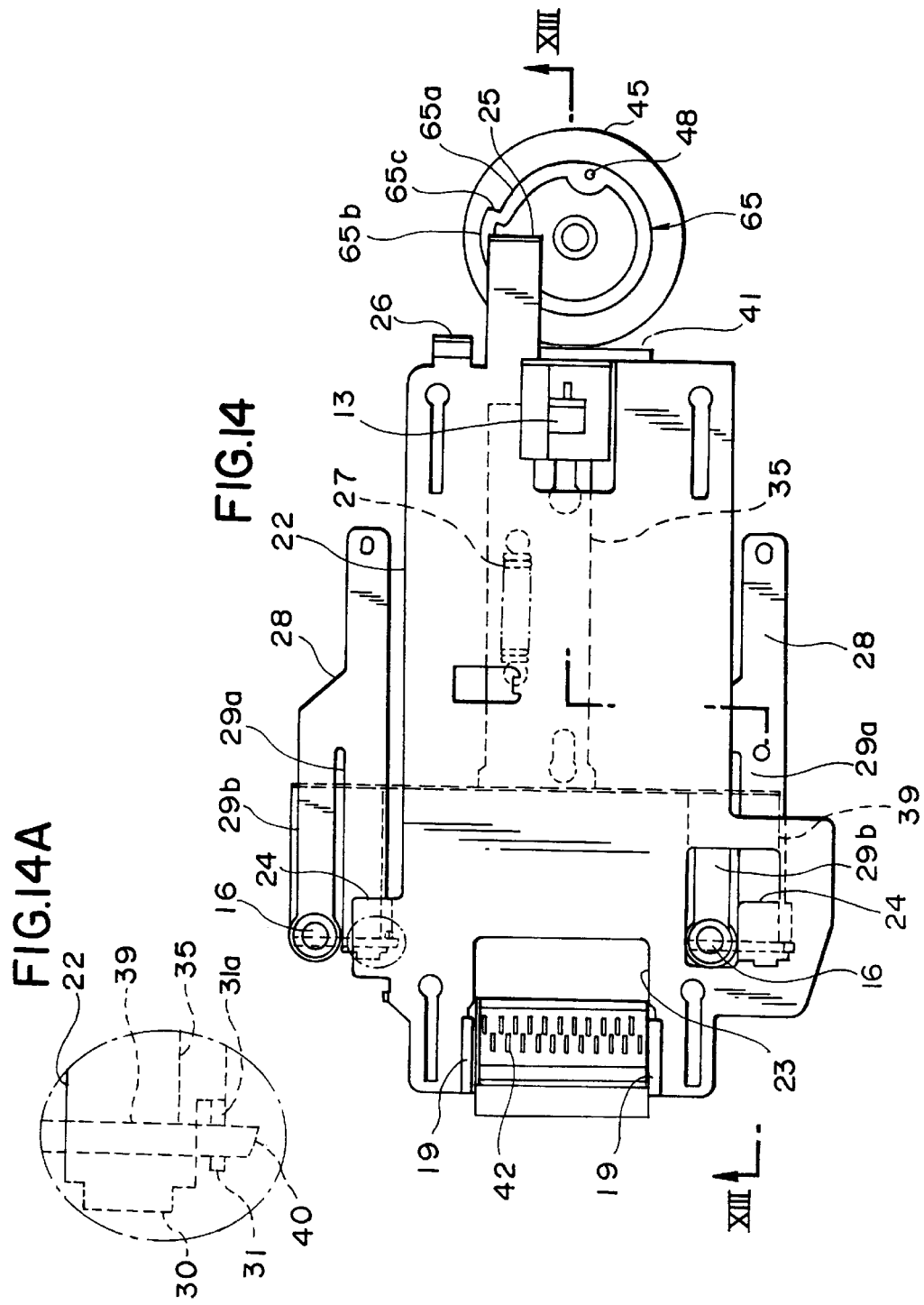

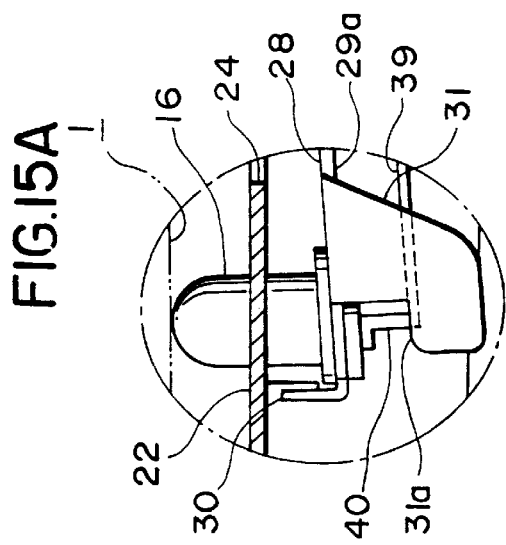
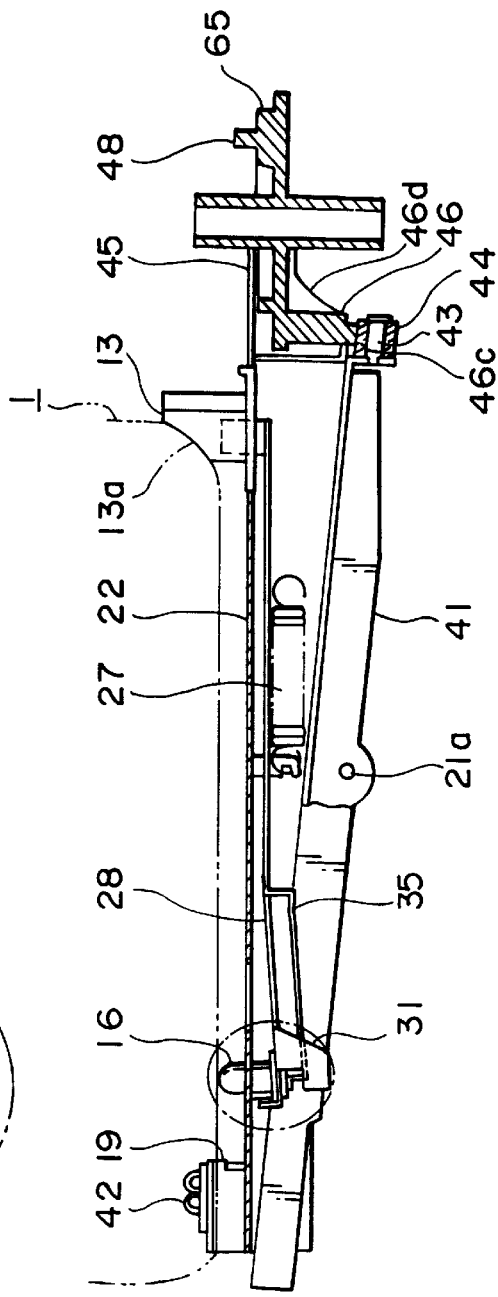

AUXILIARY DEVICE FOR ELECTRONIC APPARATUS

BACKGROUND OF THE INVENTION

1. Field of the Invention

The present invention relates to an auxiliary device for an electronic apparatus and, in particular, to an auxiliary device for an electronic apparatus which performs signal exchanges between it and the electronic apparatus.

2. Description of the Related Art

There has been proposed an auxiliary device for an electronic apparatus which is in the form of an adaptor called a station, which is used, when, for example, a portable electronic apparatus whose functions are limited to some extent for the sake of portability is used indoors. In such a case, the portable electronic apparatus is connected to the adaptor so that it may be endowed with the same functions as those of an installed-type electronic apparatus.

FIGS. 1 and 2 show an example of a connection mechanism used in such an adaptor serving as an auxiliary device for an electronic apparatus.

A slider a is slidably supported by a chassis (not shown). A coil spring b is stretched between the slider a and the chassis (not shown), whereby the slider a is biased to the right in FIG. 1, i.e., in the direction of an arrow A.

Engagement sections c are formed in the portion of the slider a which is near the left-hand end thereof as seen in FIG. 1. Further, in the right-hand end portion of the slider a, there is formed a cutout d which is laterally elongated and open at the right-hand end. In those side edge portions of the slider a which are nearer to the left-hand end thereof, cutouts are formed whose left-hand ends constitute abutting edges e. A cut-and-raised portion f is formed in the slider a at a position nearer to the right-hand end thereof, and a roller g is rotatably supported by this cut-and-raised portion f.

Substantially the central portion of a control member h consisting of a plate spring material is fastened to the chassis (not shown). A substantially reverse-L-shaped section protrudes to the left from substantially the central section of the laterally elongated portion of the control member h, that is, the left-hand side portion of the control member h is branched into two sections. A placement detecting shaft i is fixed to the right-hand end portion of the control member h so as to protrude upwards therefrom. The lower end portion of this placement detecting shaft i is formed as a large diameter section i1, and the portion extending upwards therefrom is formed as a small diameter section i2 whose outer diameter is smaller than that of the large diameter section i1. A head section i3 whose outer diameter is larger than that of the small diameter section i2 is formed on the small diameter section i2. The outer diameter of the small diameter section i2 is slightly smaller than the width of the cutout d of the slider a and the outer diameter of the large diameter section i1 is larger than the width of the cutout d.

The left-hand end portion of each arm of the branched portion is bent upwards to form stopper members j. Upwardly protruding placement detection protrusions k are provided on the left-hand end portions (FIGS. 1 and 2) of the outer side edges.

In the condition in which one apparatus is not placed on the placement surface of the other apparatus, for example, in the condition in which the portable electronic apparatus as mentioned above is not attached to the adaptor, the head section i3 of the placement detection shaft i protrudes upwards through a hole formed in the placement surface of a casing (not shown), and the upper end portions of the placement detection protrusions k protrude beyond the placement surface through holes formed in the placement surface. In this condition, the stopper members j of the control member are, as shown in FIG. 1, positioned on the right-hand side of the abutting edges e of the slider a, whereby the slider a is prevented from moving to the right (the direction indicated by the arrow A in FIG. 1). The position of the slider a in this condition is the non-engagement position. When the slider a is in the non-engagement position, the large diameter section i1 of the placement detection shaft i is at a height corresponding to the cutout d of the slider a and a shutter (not shown) supported by the slider a closes connector protrusion holes formed in the placement surface of the casing.

A laterally elongated connector support member l is supported by the chassis (not shown) at a position to the right from the center thereof so as to be vertically rotatable. A spring peg n protrudes downwards from the lower edge of the portion where the rotation fulcrum m of the connector support member l exists, and a coil spring o is stretched between the spring peg n and the chassis. As a result, as shown in FIG. 2, the connector support member l is biased so as to rotate such that the left-hand end portion thereof moves downwards. A protrusion p to be depressed, which protrudes upwards, is formed at the right-hand end of the connector support member l, and a movable connector q is arranged on the upper surface of the left-hand end portion thereof.

When an electronic apparatus r which constitutes one apparatus (Only a part of the casing thereof is shown in the drawing) is placed on a placement surface (not shown) of an adaptor which constitutes the other apparatus (At this time, the right-hand end portion of the bottom surface of the one apparatus r is abutted against the placement surface, and then the left-hand end portion is gradually caused to abut the placement surface), the head section i3 of the placement detection shaft i is first pushed in by the right-hand side bottom surface of the one electronic apparatus r, whereby the small diameter section i2 of the placement detection shaft i reaches a height corresponding to the cutout d of the slider a.

Since the placement detection protrusions k are depressed by the left-hand side bottom surface of the electronic apparatus r, each arm of the branched portion of the control member h is deflected such that the left-hand end thereof moves downward, that is, as shown in FIG. 2, elastically displaced from the position indicated by the solid line to the position indicated by the two-dot chain line, whereby the stoppers j move downward from the position indicated by the solid line in FIG. 2 to the position indicated by the two-dot chain line, and the engagement of the slider a with the abutment edges e is cancelled, so that the slider a moves to the right in the direction indicated by the arrow A of FIGS. 1 and 2 by the moving force due to the biasing of the coil spring b. At this time, the small diameter section i2 of the placement detection shaft i is inserted into the cutout d of the slider a, whereby the movement of the slider a to the right is permitted.

By this movement to the right of the slider a, the engagement sections c thereof engage with an engagement section (not shown) of the electronic apparatus r, and the shutter (not shown) supported by the slider a moves to thereby open a connector protrusion hole (not shown) formed in the placement surface.

At the same time, the roller g supported by the slider a pressurizes to the right (in the direction indicated by the arrow A of FIG. 2) the protrusion p to be depressed of the connector support member l, so that the connector support member l is rotated against the rotating force due to the coil spring o such that the left-hand end thereof is rotated upwards as indicated by the arrow B of FIG. 2, so that the movable connector q supported at the left-hand end thereof protrudes upwards through the connector protrusion hole (not shown) to be connected to a connector for connection (not shown) of the electronic apparatus r.

The above-described connection mechanism has a problem in that each section thereof may be brought into a halfway state by an erroneous operation.

That is, as described above, first, the placement detection shaft i is depressed and then the placement detection protrusions k are depressed, whereby the slider a moves to the right in the direction of the arrow A in FIG. 1, and the keeping of the placement of the electronic apparatus r on the placement surface and the connection of the movable connector q to the connector for connection are effected. However, if something goes wrong and the placement detection protrusions k are depressed first, the stoppers j move downward and the lock for the slider a is cancelled, so that the slider a moves to the right. However, since the placement detection shaft i is not depressed, the large diameter section ii of the placement detection shaft i is at a height corresponding to the cutout d of the slider a, so that the placement detection shaft i cannot enter the cutout d, with the result that the slider a stops, as indicated by the two-dot chain line of FIG. 2, when the right-hand side edge thereof abuts the large diameter section i1 of the placement detection shaft i. In this condition, the right-hand side edge of the slider a is in press contact with the placement detection shaft i due to the force of the coil spring b, so that this placement detection shaft i cannot be pushed down. As a result, the lock is effected in a halfway state in which the slider a is only slightly moved to the right.

Further, in the above-described connection mechanism, it is not possible to obtain a stable press-contact force for the connector for connection on the electronic apparatus r side and the movable connector q on the adaptor side.

That is, the press-contact force for the connector for connection and the movable connector q depends upon the spring force of the coil spring o which acts through the slider a and the connector support member l. However, since the coil spring o is stretched between the slider a and the chassis, the force which brings the movable connector q into press contact with the connector for connection varies depending upon the frictional resistance, etc. between the slider a and the chassis. In addition, the frictional resistance etc. between the slider a and the chassis greatly varies due to deformation, etc. of these components. As a result, it is difficult to obtain a press-contact force for the connector for connection and the movable connector as designed, and a marked deviation occurs due to contamination and deformation of the members as the apparatus ages.

SUMMARY OF THE INVENTION

It is therefore an object of the present invention to provide an auxiliary device for an electronic apparatus which resolves the above-mentioned problem.

According to the present invention, there is provided an auxiliary device for an electronic apparatus including: an attachment section; first and second detection mechanisms; and a holding mechanism, wherein the electronic apparatus is attached to an attachment section, wherein the first and second detection mechanism are operated by the electronic apparatus attached to the attachment section, wherein the holding mechanism holds the electronic apparatus attached to the attachment section, and wherein the holding mechanism holds the electronic apparatus when the first detection mechanism is operated by the electronic apparatus attached to the attachment section and then the second detection mechanism is operated by the electronic apparatus.

According to the present invention, there is provided an auxiliary device for an electronic apparatus, wherein the electronic apparatus has a connection terminal, wherein the auxiliary device includes an attachment section, first and second detection mechanisms, an input/output section and a movement mechanism, wherein the electronic apparatus is attached to the attachment section, wherein the first and second detection mechanism are operated by the electronic apparatus attached to the attachment section, wherein the holding mechanism holds the electronic apparatus attached to the attachment section, wherein the holding mechanism holds the electronic apparatus when the first detection mechanism is operated by the electronic apparatus attached to the attachment section and then the second detection mechanism is operated by the electronic apparatus, wherein the input/output section is connected to the connection terminal of the electronic apparatus held by the holding mechanism to perform exchange of signals, and wherein the movement mechanism causes the input/output section to move between a first position where it is connected to the connection terminal and a second position where it is separated from the connection terminal.

BRIEF DESCRIPTION OF THE DRAWINGS

FIG. 10 is a plan view showing the relationship between a lock slider, a plate spring member and a lock release lever when the lock slider is at a non-engagement position;

FIG. 11 is a sectional view taken along the line IX—IX of FIG. 10;

FIG. 13 is a sectional view taken along the line XI—XI of FIG. 12;

FIG. 14 is a plan view showing the relationship between the lock slider, the plate spring member and the lock release lever when the lock slider is at the engagement position;

FIG. 15 is a sectional view taken along the line XIII—XIII of FIG. 10;

DESCRIPTION OF THE PREFERRED EMBODIMENT

An electronic apparatus and an auxiliary device therefor according to an embodiment of the present invention will now be described in detail with reference to the drawings. The embodiment will be described with respect to a case in which a portable electronic apparatus, for example, a portable type disc recording and/or reproducing apparatus (hereinafter referred to simply as the "disc player"), is used as the electronic apparatus, and in which a station adaptor is used as the auxiliary device, to which the disc player is attached and which has a function by which it performs edit operation by using the disc player as the recording and/or reproducing section, etc.

A disc player 1 uses a disc cartridge accommodating a magneto-optical disc having a diameter of approximately 64 mm, and solely has a function for performing basic recording and/or reproduction. This is due to the importance of portability required of the disc player 1 as a portable electronic apparatus. Apart from the function and switches for the selection between the basic operations of recording and reproduction, the disc player 1 has a function for selecting display information required for recording or reproduction.

The disc player 1 is attached to the station adaptor 2 to be mechanically held and electrically connected thereto. The station adaptor 2 has functions required for performing various edit operations including the division of information, for example, music information, recorded on the magneto-optical disc with which the disc player 1 is loaded into a plurality of portions, the synthesis of a plurality of items of music information, the erasing of music information, the changing of the order, and the provision of the disc name or the name of the piece of music played. Apart from these, the station adaptor 2 has a function for charging the secondary battery in the disc player 1 when the disc player 1 has been attached, an external input terminal for supplying analog or digital input signals from outside to the disc player 1 attached, and an external output terminal for outputting output signals from the disc player 1 to an external apparatus.

Figures 3, 3A:
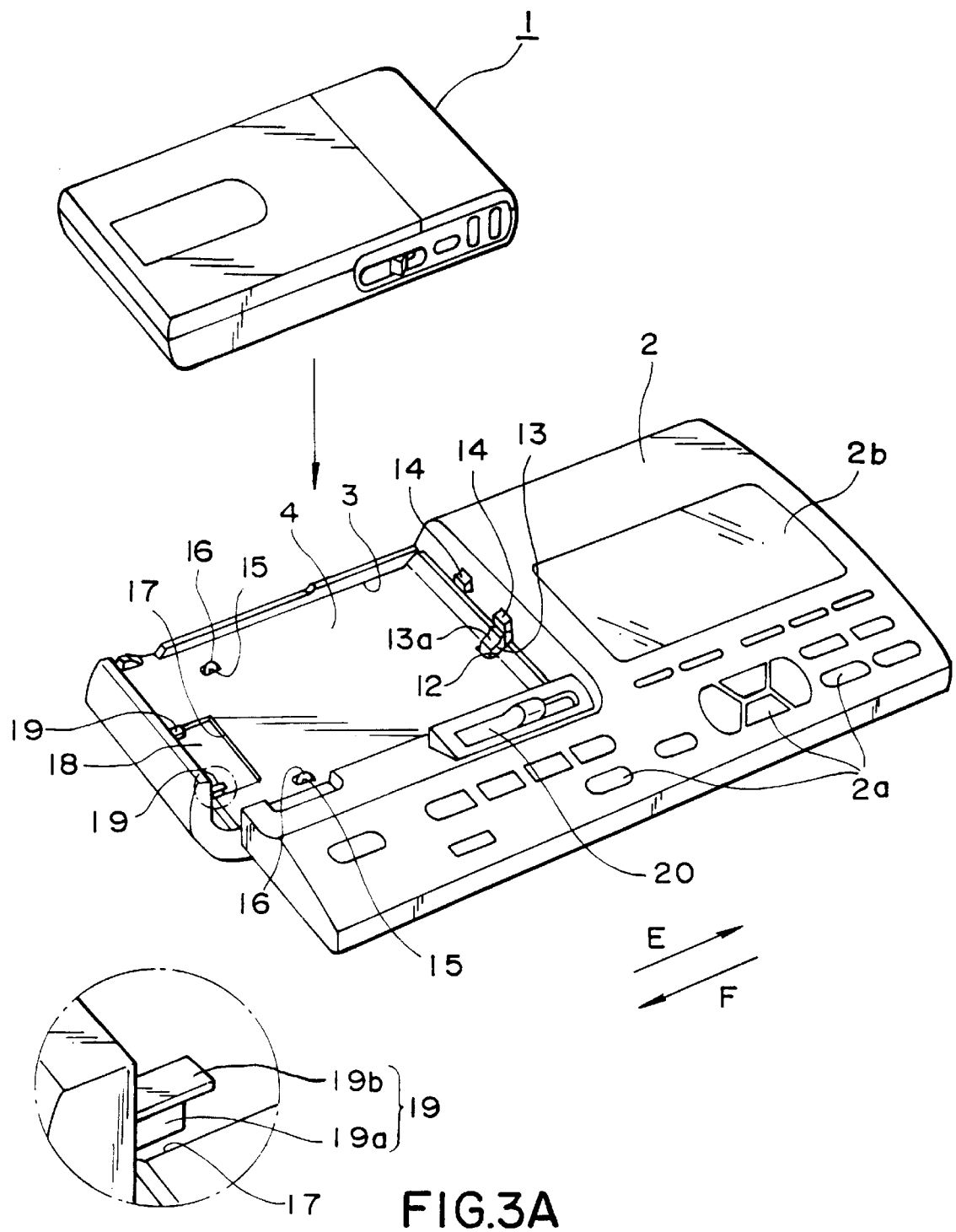
FIG. 3 is a perspective view showing the construction of a disc player constituting the electronic apparatus and of a station adaptor constituting the auxiliary device of an embodiment of the present invention.
Figure 4:
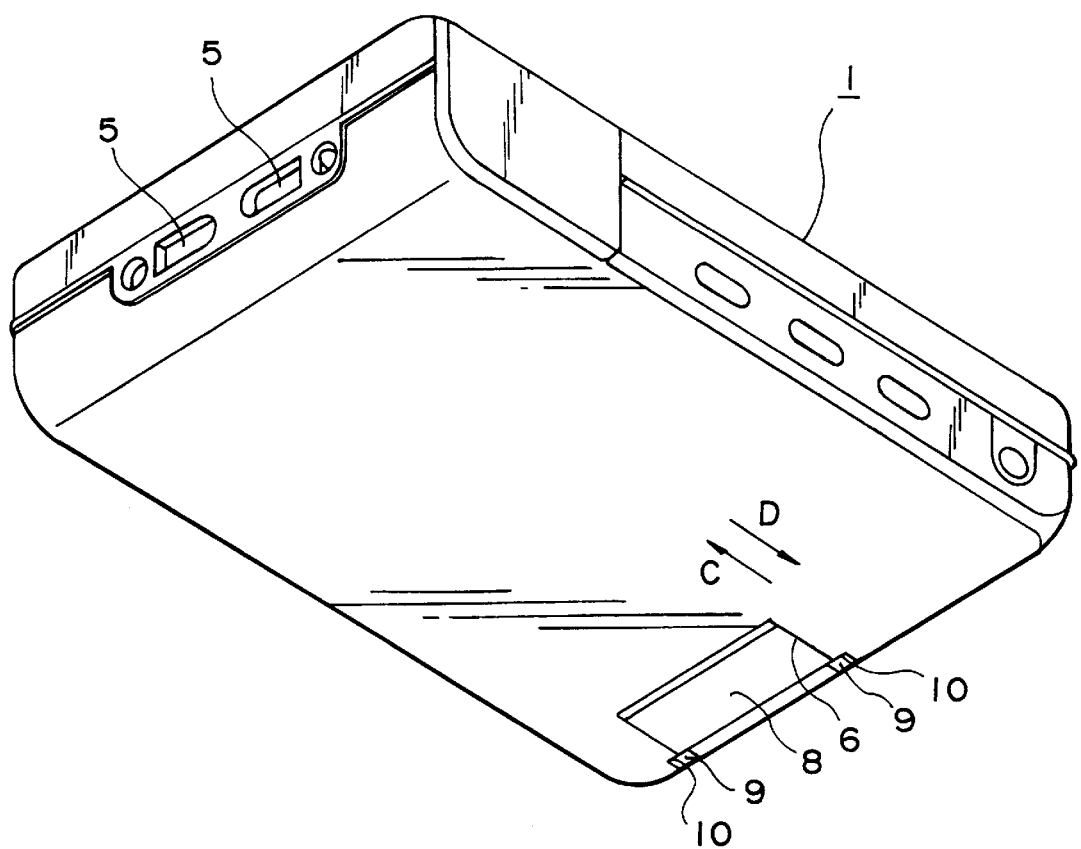
FIG. 4 is a perspective view of the disc player as seen from the bottom side.

As shown in FIGS. 3 and 4, the disc player 1 is formed as a laterally elongated rectangular thin box, and has on the right-hand end surface thereof two engagement recesses 5 arranged longitudinally side by side. At the left-hand end of the bottom surface of the disc player 1, there is formed a longitudinally elongated rectangular opening 6, and a connector 7 for connection is arranged inside the opening 6.

As shown in FIG. 4, a cover 8 for opening and closing the opening 6 is provided so as to be slidable to the right and left. The cover 8 is biased in the direction indicated by the arrow D in FIG. 4 by a resiliency mechanism (not shown). Lock members 9 which are vertically movable so as to project from and retract into the casing of the disc player 1 are arranged longitudinally on both sides of the left-hand end portion of the opening 6. The lock members 9 are biased downwards, i.e., so as to project from the casing, by another resiliency mechanism (not shown).

Cutouts 10 are formed in the portions corresponding to the side edge portions of the opening 6 at the lower end of the left-hand side surface of the disc player 1. When the lock members 9 have moved upwards and the cover 8 has been moved in the direction of the arrow C in FIG. 4 so as to open the opening 6, longitudinal side edges of the opening 6 can be seen from the left through the cutouts 10, and the side edges 11 serve as portions to be engaged.

Figure 2:
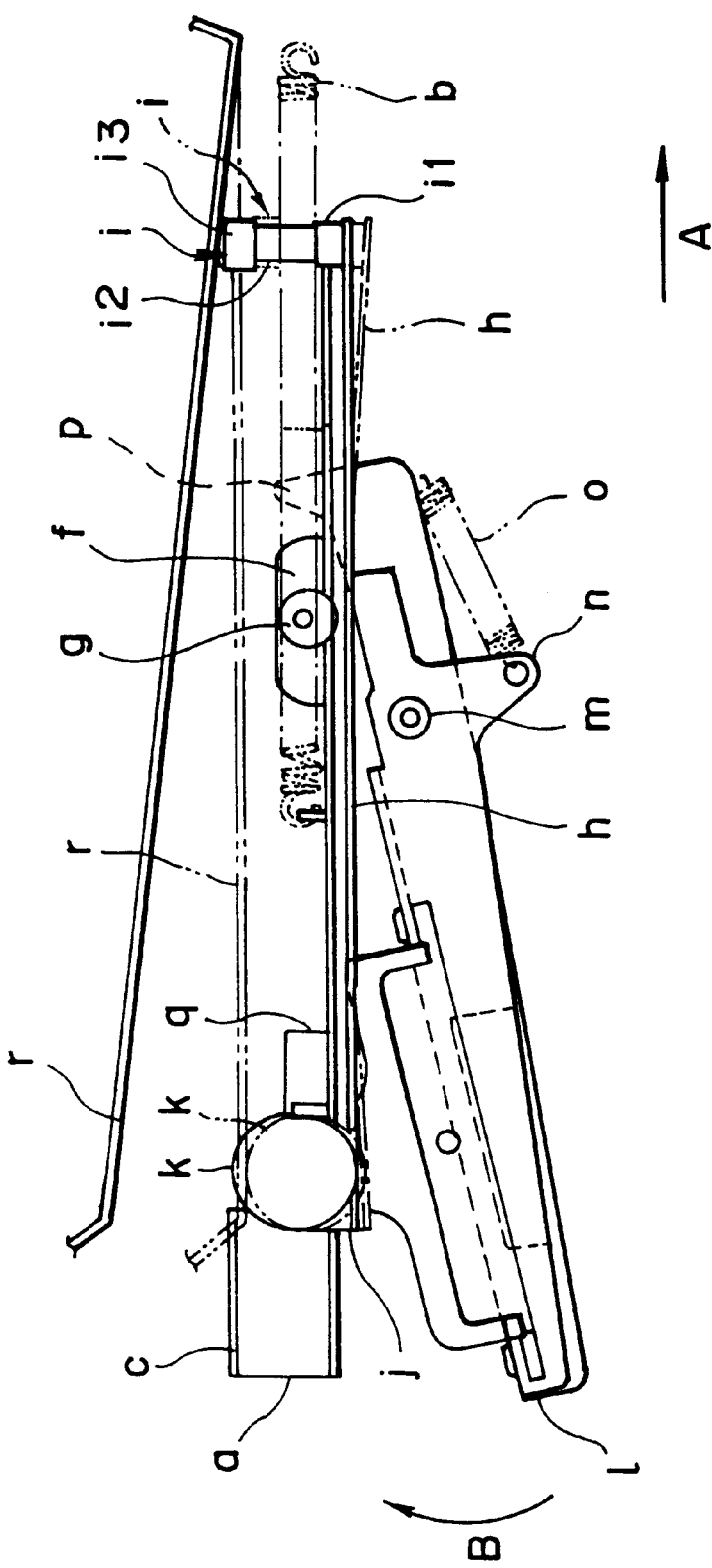
FIG. 2 is a plan view of the connection mechanism shown in FIG. 1.
Figure 5:
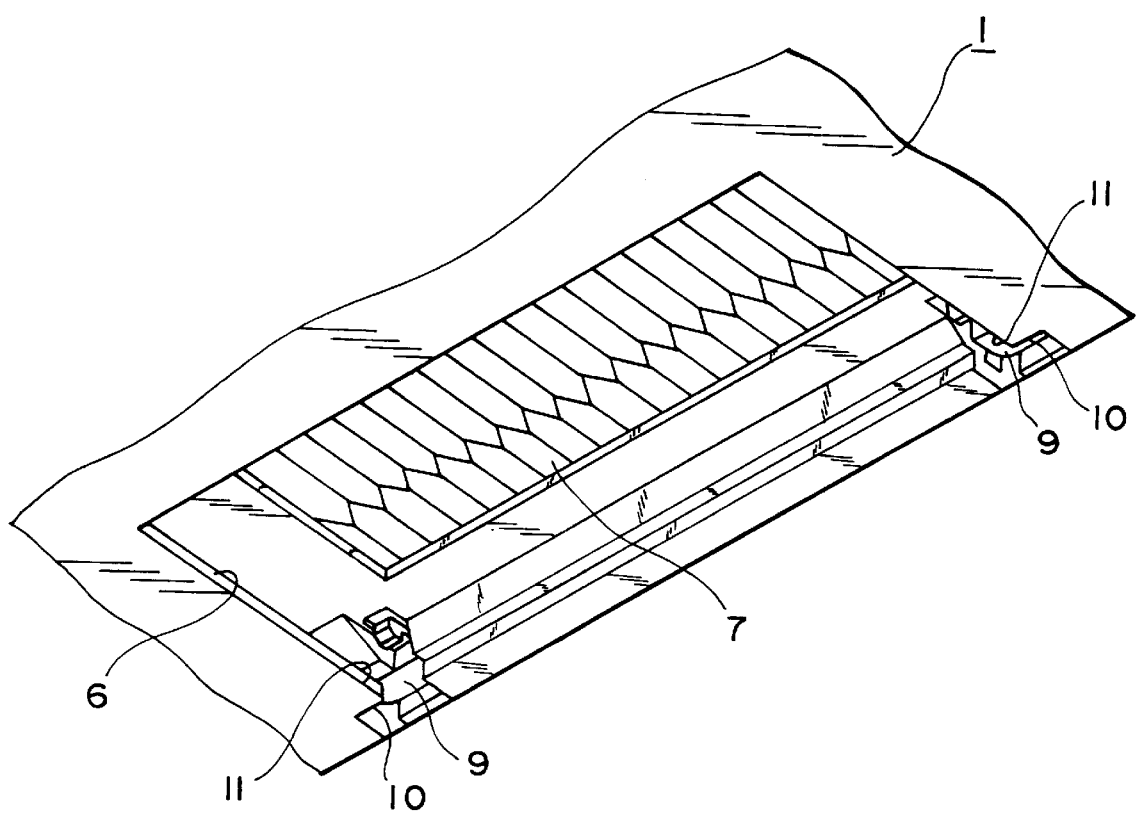
FIG. 5 is an enlarged perspective view of the essential part of the terminal portion of the disc player.

The cover 8 is a close position when it has been moved in the direction of the arrow D in FIG. 2 until the portion thereof at the left-hand end position of its range of movement closes the opening 6 thereby closing the connector 7, and it is at the exposing position when, conversely, the portion thereof at the right-hand end position of the range of movement thereof has opened, as shown in FIG. 5, exposing the opening 6 thereby exposing to the exterior of the connector 7 for connection therewith.

The lock position corresponds to the condition in which, when the cover 8 is at the closed position as shown in FIG. 4, the lock members 9 are at the lower end of their range of movement. In this condition, the cover 8 is prevented from moving so as to open the opening 6, that is, moving in the direction indicated by the arrow C in FIG. 4. The lock release position corresponds to the condition in which the lock members 9 have been pushed upwards from the lower side of the disc player 1 into the disc player 1. In this condition, the cover 8 is permitted to move in the direction of the arrow C in FIG. 4.

As shown in FIG. 3, the station adaptor 2 has on a part of its upper surface a laterally elongated rectangular shallow recess 3 whose configuration corresponds to the contour of the disc player 1. The bottom surface of this recess 3 constitutes the placement surface for the disc player 1. The station adaptor 2 is equipped with a plurality of operating switches 2a and a display section 2b for making it possible to conduct edit operation, etc. as described above by using the attached disc player 1 as the recording and/or reproducing section. This display section 2b displays various items of information required for edit operation as well as time information on recording or reproducing time, the name of the piece of music played, etc. The disc player 1 is electrically connected to a connector for connection and a movable connector described below, whereby signals are exchanged between the station adaptor 2 and the disc player 1. That is, by operating one of the plurality of operating switches 2a, it is possible to perform recording and reproducing operations with the disc player 1 and edit operation. As stated above, information, such as time, is displayed on the display section 2b on the basis of a signal supplied from the disc player 1.

Substantially in the middle portion with respect to the longitudinal dimension of the right-hand end portion of the placement surface 4 of the station adaptor 2, there is provided, through a slit extending to the right and left, a first placement detecting mechanism 13 which is capable of moving to the right and left. The first placement detecting mechanism 13 is biased so as to move to the left by a resiliency mechanism described below. The left-hand side surface 13a of the first placement detecting mechanism 13 is formed so as to be a curved surface corresponding to the configuration of the right-hand end portion of the bottom section of the disc player 1. Two engagement protrusions 14 are arranged longitudinally side by side on the right-hand inner side surface of the recess 3 of the station adaptor 2.

At positions on the placement surface 4 which are longitudinally spaced apart from each other, there protrude through insertion holes 15 pin-like second placement detection mechanisms 16 such that they can protrude and retract from and within the placement surface 4. The second placement detection mechanisms 16 are biased by a resiliency mechanism described below so as to project from the placement surface 4.

At a position nearer to the forward end than the center of the left-hand end portion of the placement surface 4, there is provided a longitudinally elongated connector projection hole 17, and a shutter 18 for opening and closing the connector projection hole 17 is provided.

Engagement sections 19 protrude at positions in contact with the left-hand end portions of the longitudinal side edges of the connector projection hole 17. The positions of these engagement sections 19 shown in FIG. 3 are the non-engagement positions. In this condition, the right-hand end portions of the engagement sections 19 protrude into the recess 3 from the left-hand inner side surface of the recess 3. These engagement sections 19 have plate-like raised portions 19a extending laterally and vertically and engagement portions 19b protruding horizontally from the upper edge of the raised portions 19a so as to be spaced apart from each other. These engagement sections 19 are biased by a resiliency mechanism described below in the direction indicated by the arrow E in FIG. 3. The engagement sections 19 are locked at the non-engagement positions by a stopper described below.

A detachment lever 20 is provided on the upper surface of the station adaptor 2 at a position in front of the recess 3 so as to be movable in the directions indicated by the arrows E and F in FIG. 3. The detachment lever 20 is biased in the direction of the arrow F in FIG. 3 by a resiliency mechanism described below.

Figure 1:
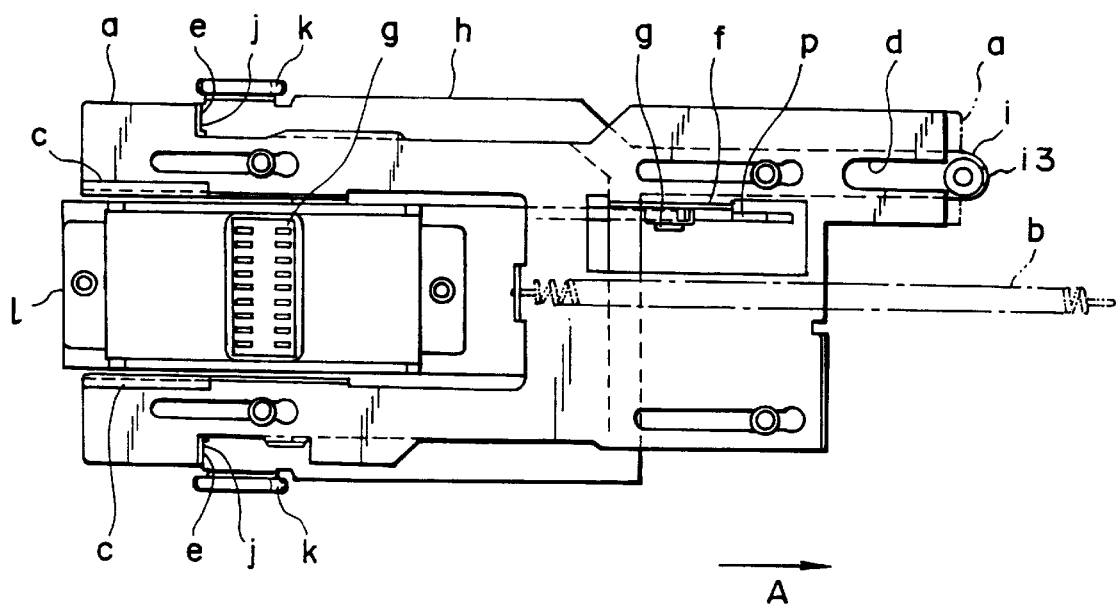
FIG. 1 is a sectional view showing the construction of a connection mechanism of an auxiliary device for an electronic apparatus on which the present invention is based.

When, in the condition in which the first placement detection mechanism 13 has moved in the direction of the arrow E in FIG. 1, the second placement detection mechanisms 16 are moved downwards, i.e., so as to retract within the placement surface 4, the lock of the engagement sections 19 to the non-engagement positions is cancelled, and, due to the biasing force applied thereto, the engagement sections 19 are moved in the direction of the arrow E, i.e., toward the engagement positions, and, at the same time, the shutter 18 is moved to the position where it opens the connector 17. However, if, in the condition in which the first placement detection mechanism 13 has not been moved in the direction of the arrow E, only the second placement detection mechanisms 16 are moved downwards, the lock of the engagement sections 19 to the non-engagement positions is not cancelled. A detailed description in this regard will be given below.

The movement of the first placement detection mechanism 13 in the direction of the arrow E and the downward movement of the second placement detection mechanisms 16 are effected through the placement and attachment of the disc player 1 on and to the placement surface 4.

In the condition shown in FIG. 3, the disc player 1 is slightly inclined so that the right-hand end portion thereof comes down, and, in this condition, the right-hand end of its bottom surface is abutted against the portion of the placement surface 4 which is somewhat to the left of the first displacement detection mechanism 13. In this condition, the entire disc player 1 is moved in the direction of the arrow E while gradually lowering the left-hand end portion of the disc player 1, with the right-hand end of the bottom surface being kept in contact with the placement surface 4, whereby the first placement detection mechanism 13 is moved from the position shown in FIG. 8 to the position shown in FIG. 9, and, at the same time, the second placement detection mechanisms 16 are pushed in downwards. When the disc player 1 has been completely placed on the placement surface 4, the first detection mechanism 13 moves to the predetermined position shown in FIG. 9 and the second placement detection mechanisms 16 are completely pushed in downwards. At the same time, the right-hand end portions of the engagement sections 19 push the lock members 9 of the disc player 1 relatively upwards, i.e., into the disc player 1, so that the lock to the closing position with respect to the cover 8 is cancelled. Engagement protrusions formed on the right-hand inner side surface of the recess 3 are engaged with the engagement recesses 5 formed on the right-hand end surface of the disc player 1.

Figure 8:
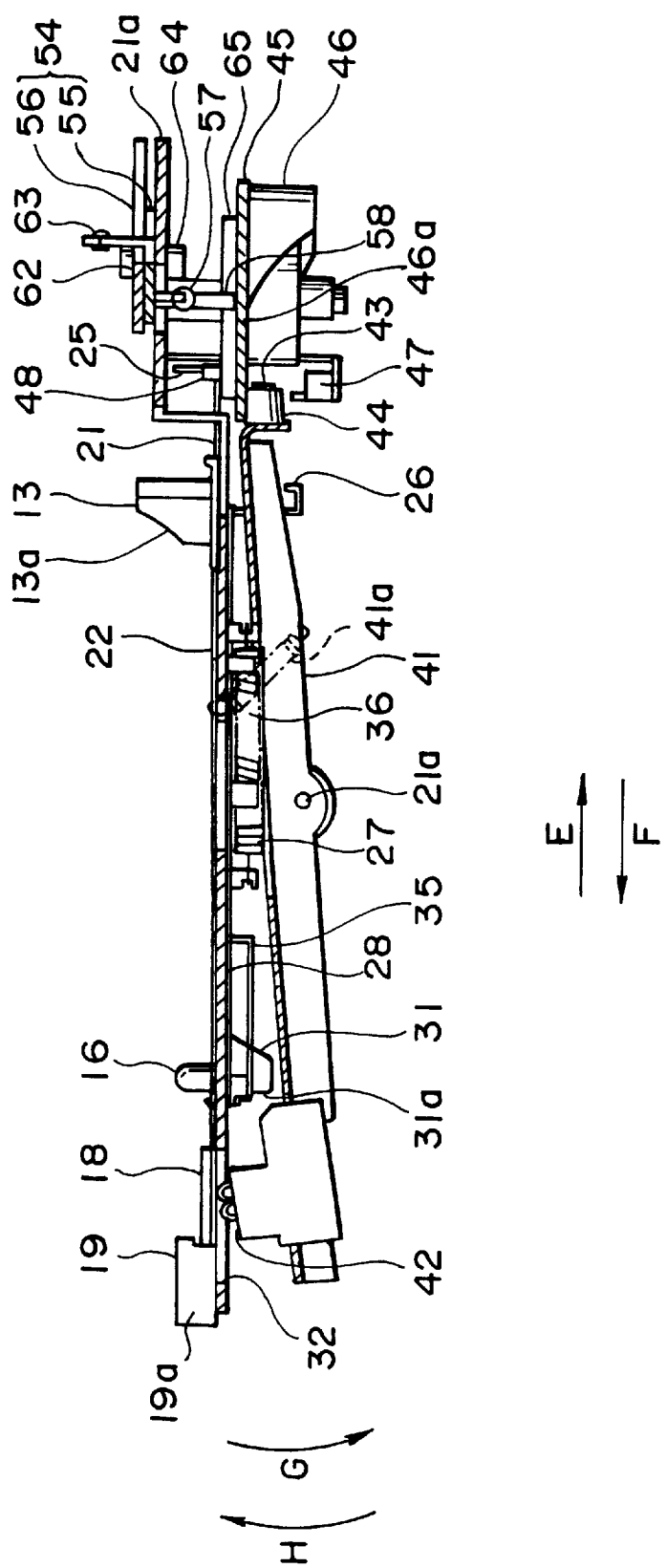
FIG. 8 is a sectional view taken along the line VI—VI of FIG. 5.
Figure 9:
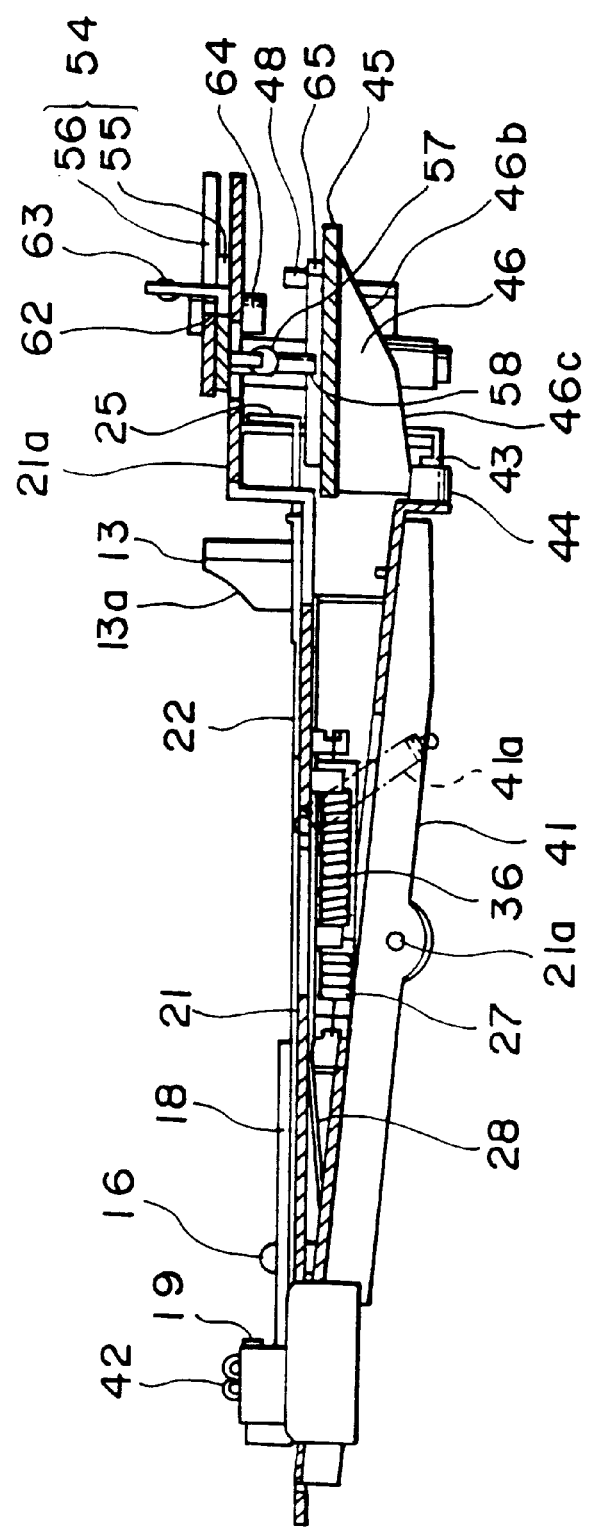
FIG. 9 is a sectional view taken along the line VI—VI of FIG. 5, showing a movable connector at a connecting position.

With the operation to move the first placement detection mechanism 13 in the direction of the arrow E in FIG. 3, the engagement sections 19 are moved from the positions shown in FIG. 8 to the positions shown in FIG. 9. With this movement of the engagement sections 19, the right-hand end portions of the engagement sections 19 pressurize the longitudinal end portions at the left-hand end of the cover 8 to the right, so that the cover 8 is moved in the direction of the arrow C in FIG. 4, that is, to the exposed position. The engagement portions 19b of the engagement sections 19 slide over the portions to be engaged 11 of the disc player 1 and are engaged therewith. After this, a movable connector described below protrudes beyond the placement surface 4 through the connector protrusion hole 17 to the position shown in FIG. 9 and is brought into press contact with the connector 7 for connection of the disc player 1. In this way, the disc player 1 is mounted on the station adaptor 2.

When detaching the disc player 1 from the station adaptor 2, the detachment lever 20 is moved in the direction of the arrow E in FIG. 3, whereby the movable connector, which has been in the state in which it is protruded upward from the placement surface 4, is retracted inwards from the connector protrusion hole 17, and the engagement sections 19 are restored to the non-engagement positions, a shutter described below closing the connector protrusion hole 17, whereby the disc player 1 is released from the placement surface 4 of the station adaptor 2.

Next, the mechanism for realizing the above-described operations will be described in detail.

Figure 6:
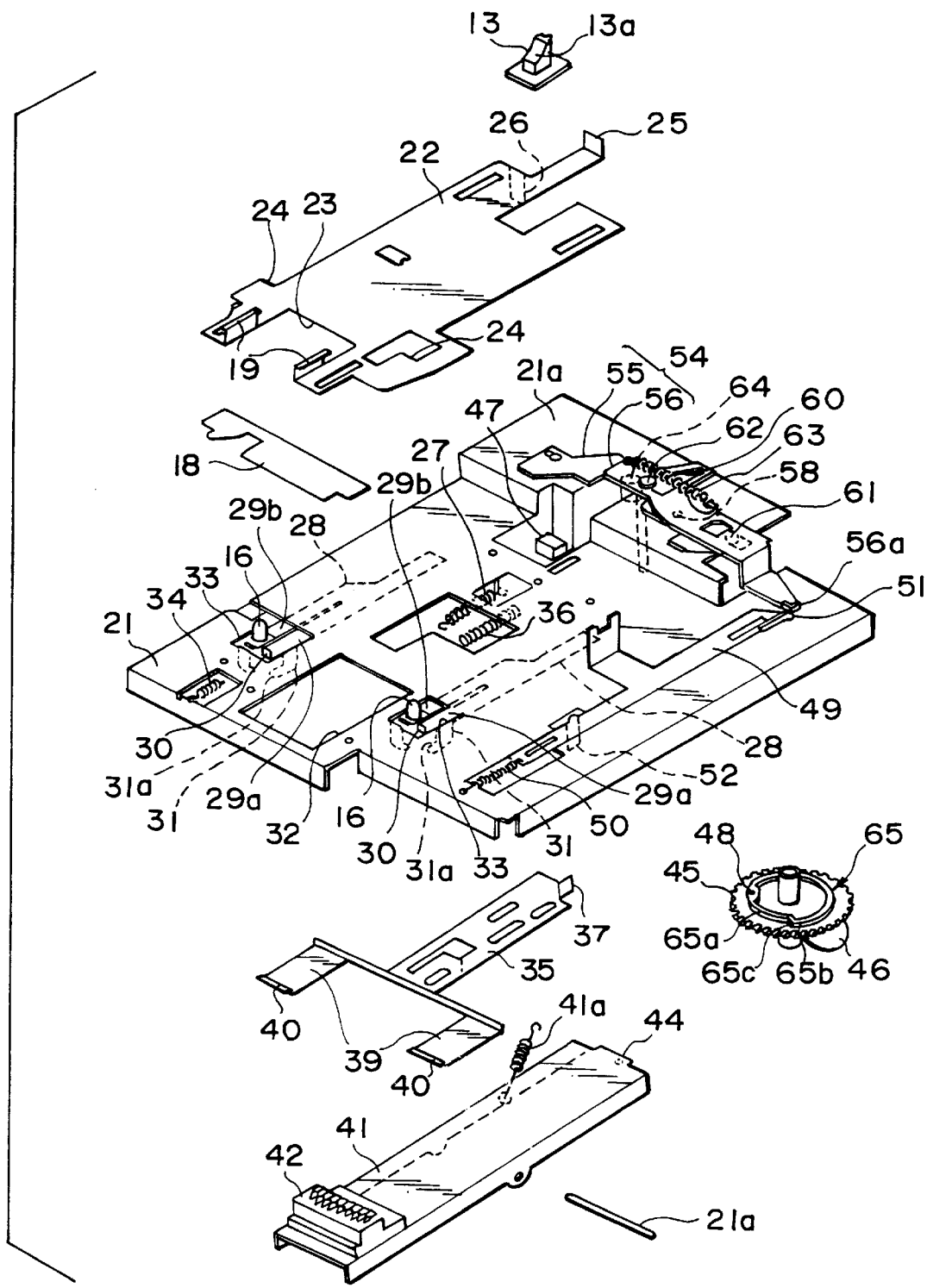
FIG. 6 is an exploded perspective view showing the construction of the essential part of the station adaptor.
Figure 7:
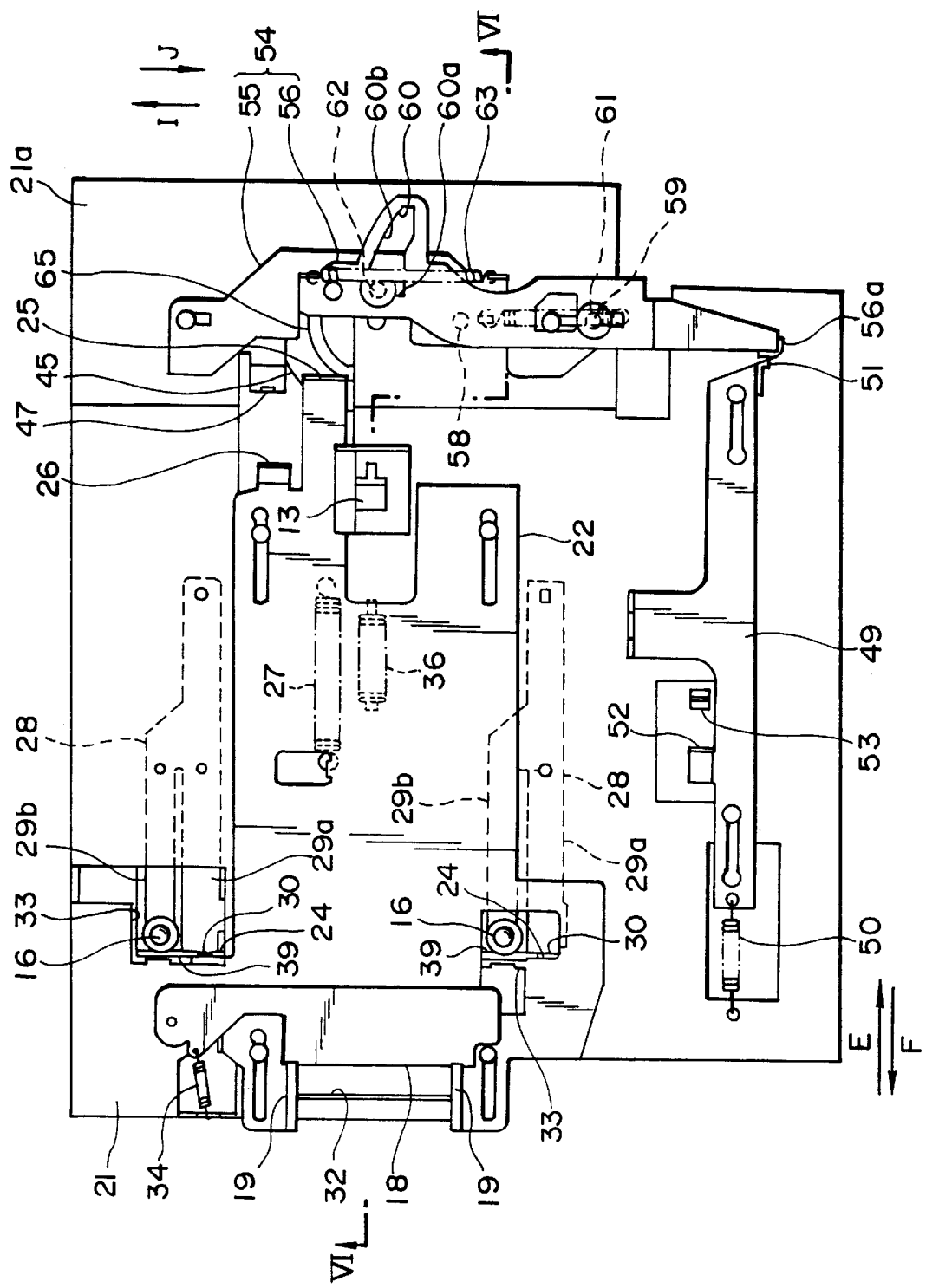
FIG. 7 is a plan view showing the construction of the essential part of the station adaptor.

As shown in FIGS. 6 and 7, the chassis 21 has a forward end portion 21a which is somewhat higher than the other portion of the chassis 21 except for that section of the forward end portion 21a which is positioned somewhat to the right.

As shown in FIG. 7, a substantially laterally elongated plate-like lock slider 22 is supported on the substantially left-hand side half of the upper surface of the chassis 21 so as to be slidable to the right and left. As shown in FIG. 6, a substantially rectangular cutout 23, which is open on the left-hand end, is formed in the left-hand end portion of the slider 22. The engagement sections 19 are formed at both side edges of the left-hand end portion of the cutout 23. The raised portions 19a are raised upwards from both longitudinal side edges of the cutout 23, and the engagement portions 19b protrude horizontally from the upper edges of the raised portions 19a so as to be spaced apart from each other.

At positions somewhat to the right from the left-hand end of the lock slider 22, there are formed engagement edges 24 which are directed to the right. At the right-hand end of the lock slider 22, there is formed an upwardly protruding member to be depressed 25, and, at a position somewhat to the left of the member to be depressed 25, there is formed a downwardly protruding switch depression member 26.

As shown in FIGS. 7 and 8, a coil spring 27 serving as a resiliency mechanism is stretched between the lock slider 22 and the chassis 21, and, by this coil spring 27, a biasing force in the direction of the arrow E in FIG. 7 is applied to the lock slider 22.

As shown in FIG. 6, plate spring members 28 are fixed to the lower side of the chassis 21. The plate spring members 28 are formed as laterally elongated plates, the left-hand portion of each of them having forked portions. Substantially the central portion and the left-hand end portion of each of the plate spring members 28 is fixed to the chassis 21. The two forked portions 29a and 29b serve as the resilient portions of the resiliency mechanisms.

As shown in FIGS. 10 and 11, the left-hand end portions of the resilient portions 29a of the plate spring members 28 are bent upwards, and the portions 30 thus bent serve as stoppers. From the forward edge portions somewhat to the right of the left-hand end portions of the resilient portions, L-shaped hook members 31 protrude downward, and the horizontally extending lower portions 31a of the hook members 31 extend to the left. As shown in FIG. 11, the second placement detection mechanisms 16 are fixed to the left-hand end portions of the back-side resilient portions 29b so as to upwardly protrude therefrom.

The left-hand end portions of these resilient portions 29a and 29b are positioned underneath insertion holes 33 formed in close proximity to both sides of a laterally elongated rectangular hole 32 formed in the left-hand end portion of the chassis 21, and the stoppers 30 and the second placement detection mechanisms 16 protrude beyond the upper side of the chassis 21 through the insertion holes 33. In the condition in which the disc player 1 has not been attached to the station adaptor 2 yet, the engagement edges 24 of the lock slider 22 abut the stoppers 30 from the left-hand side, as shown in FIG. 11, whereby the lock slider 22 is locked in the non-engagement position. The positions of the stoppers 30 at this time are the lock positions. As shown in FIGS. 14 and 15, when the resilient portions 29a are deflected such that their left-hand end portions move downwards, the stoppers 30 move downwards, and removed from the right-hand side of the engagement edges 24 of the lock slider 22, so that the lock slider 22 moves to the right, from the position shown in FIG. 13 in the direction indicated by the arrow E to the position shown in FIG. 15, by the biasing force due to the coil spring 27. The positions of the stoppers 30 at this time are the lock cancelling positions.

A shutter 18 for opening and closing the connector protrusion hole 17 is rotatably supported by the chassis 21.

As shown in FIGS. 6 and 7, the shutter 18 is formed as an elongated plate, and the rear end portion thereof is rotatably supported on the upper surface of the chassis 21 at a position nearer to the left-hand end and to the rear end. A coil spring 34 is stretched between the portion somewhat in front of the rotation fulcrum thereof and the rear end portion of the chassis 21, whereby the shutter 18 is biased so as to rotate clockwise as seen from above the adaptor 2. As shown in FIG. 8, the left-hand side edge of the shutter 18 is in elastic contact with the right-hand edges of the raised portions 19a of the engagement sections 19 in the non-engagement positions. The position of the shutter 18 in this condition is the closing position, in which the connector protrusion hole 17 is closed. When the engagement sections 19 move to the engagement positions in the direction of the arrow E in FIG. 7, the left-hand side edge of the shutter 18 is pressurized in the direction of the arrow E by the raised portion 19a of the back-side engagement section 19, so that the shutter 18 rotates counterclockwise against the torque due to the coil spring 34, that is, rotates from the position to close the connector protrusion hole 17 to the position to open it, thereby opening the connector protrusion hole 17. The position of the shutter 18 in this condition is the opening position.

As shown in FIG. 6, a lock cancelling slider 35 formed of a plate spring material is supported on the lower surface of the chassis 21 so as to be slidable to the right and left. A compression spring 36 is provided between this lock cancelling slider 35 and the chassis 21, whereby the lock cancelling slider 35 is biased so as to move in the direction of the arrow F in FIG. 7.

As shown in FIG. 8, the first placement detection mechanism 13 is fixed to the upper side of the right-hand end portion of the lock cancelling slider 35. As shown in FIG. 11 or FIG. 13, a joint leg 37 protrudes downwards from the lower surface of the first placement detection mechanism 13, and, as shown in FIG. 6, the joint leg 37 is fixed to the right-hand end portion of the lock cancelling slider 35 through a laterally elongated slit formed in the chassis 21.

As shown in FIG. 6, the left-hand end portion of the lock cancelling slider 35 is formed in a U-shaped configuration open to the left, branching into two left-hand end portions 39 constituting joint sections. The joint sections 39 have a width covering the interval between the resilient portions 29a and 29b, and, as shown in FIG. 10, hook protrusions 40 protrude forward from the forward ends thereof. As shown in FIG. 11, the hook protrusions 40 are positioned slightly higher than the lower portion 31a of the hook portion 31 formed on the front-side resilient portion 29a and in correspondence with the left-hand side thereof.

Figures 12, 12A:
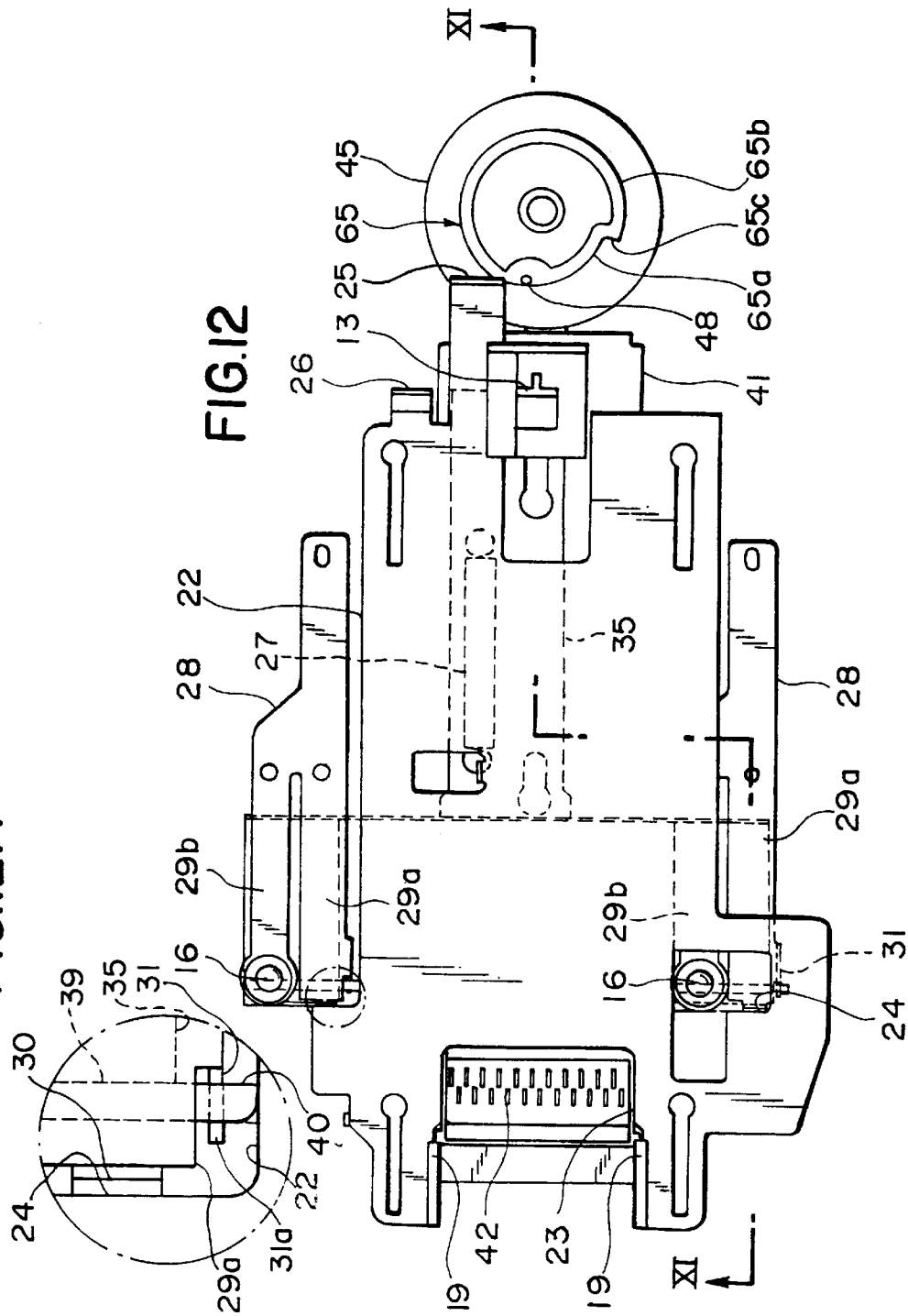
FIG. 12 is a plan view showing the construction of the lock slider, the plate spring and the lock release lever when the lock release lever is displaced.

When the lock cancelling slider 35 move from the position shown in FIGS. 10 and 11 in the direction of the arrow E to the position shown in FIGS. 12 and 13, the hook protrusions 40 move to the right and are positioned on the upper side of the lower portions 31a of the hook portions 31. In this condition, when the second placement detection mechanisms 16 move downward, the left-hand end portions of the resilient portions 29b pressurize the joint sections 39 downwards, whereby the joint sections 39 move downwards. With this movement, the hook protrusions 40 also move downward, so that the hook protrusions 40 pressurize the lower portions 31a of the hook members 31 downwards, with the result that the left-hand end portions of the resilient portions 29a move downwards, whereby, as shown in FIGS. 14 and 15, the stoppers 30 formed on the left-hand end portions move toward the lock cancelling positions.

In contrast, if, in the condition in which the lock cancelling slider 35 is not moved in the direction of the arrow E in FIGS. 10 and 11, the second placement detection mechanisms 16 move downward, the stoppers 30 do not move to the lock cancelling positions, for, although the joint sections 39 move downward, the hook protrusions 40 are positioned spaced apart to the left from the lower portions 31a of the hook members 31, so that the hook protrusions 40 fail, as it were, to hit the hook members 31.

In this way, if, in the condition in which the first placement detection mechanism 13 is not moved to the direction of the arrow E in FIGS. 7 and 8, the second placement detection mechanisms 16 move downwards, there is no change in the condition of the engagement sections 19 and the shutter 18, so that there is no concern that these mechanisms will be left in a halfway state.

Next, a mechanism for moving the movable connector between the non-connection position, where it is not connected to the connector 7 for connection, and the connection position, where it is connected to the connector 7 for connection, will be described.

As shown in FIG. 6, a connector base 41 is rotatably supported on the lower surface of the chassis 21. The connector base 41 is laterally elongated, and substantially the central portion thereof is rotatably supported by a shaft 21a provided on the chassis 21. A movable connector 42 is supported on the upper side of the left-hand end portion of the connector base 41. As shown in FIGS. 8 and 9, a shaft 43 protrudes to the right from the right-hand end of the connector base 41, and a roller 44 is rotatably supported by the shaft 43.

Figure 16:
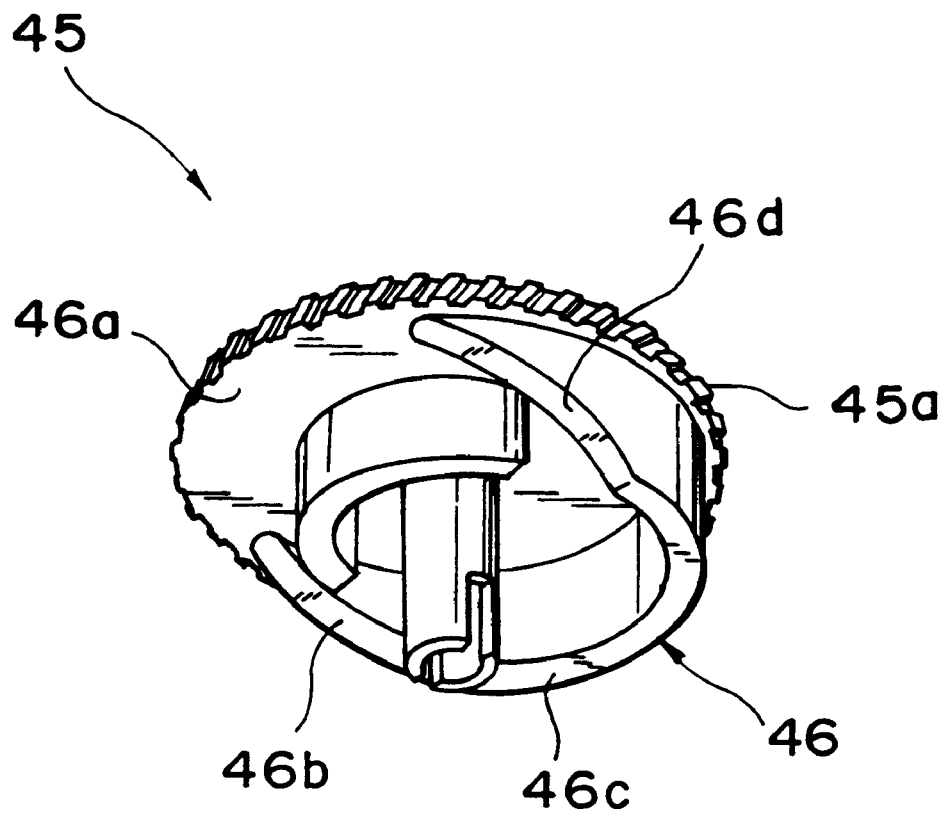
FIG. 16 is an enlarged perspective view of a cam gear.

A cam gear 45 shown in FIGS. 6, 8 and 16 is rotatably supported on the lower surface of the chassis 21. A gear portion 45a of the cam gear 45 is in mesh with a gear mechanism (not shown), and rotated counterclockwise as seen from above the adaptor 2 by a motor (not shown) through the gear mechanism.

As shown in FIGS. 6 and 16, in the portion near the peripheral edge of the lower side of the cam gear 45, there is formed a vertical cam 46 in the form of a peripheral wall. As shown in FIGS. 8 and 9, the vertical cam 46 is formed at a position corresponding to the upper portion of a roller 44 of the connector base 41, and consists of a bottom dead center portion 46a constituting substantially half the entire periphery, a rising portion 46b which is connected to the clockwise rotation end of the bottom dead center portion 46a and which is displaced downwards relatively acutely, a press contact portion 46c which is connected to the clockwise rotation end of the rising portion 46b, which extends over a range somewhat larger than a quarter of the circle and which is displaced gently downwards, and a lowering portion 46d which is connected to the clockwise rotation end of the press contact portion 46c, which is displaced acutely upwards and which is connected to the counterclockwise rotation end of the bottom dead center portion 46a. A tensile coil spring 41a is stretched between the connector base 41 and the chassis 21, whereby the left-hand end portion of the connector base 41 is biased so as to rotate downwards as indicated by the arrow G in FIG. 8. Thus, the roller 44 is in elastic contact with the vertical cam 46 of the cam gear 45.

Figure 17:
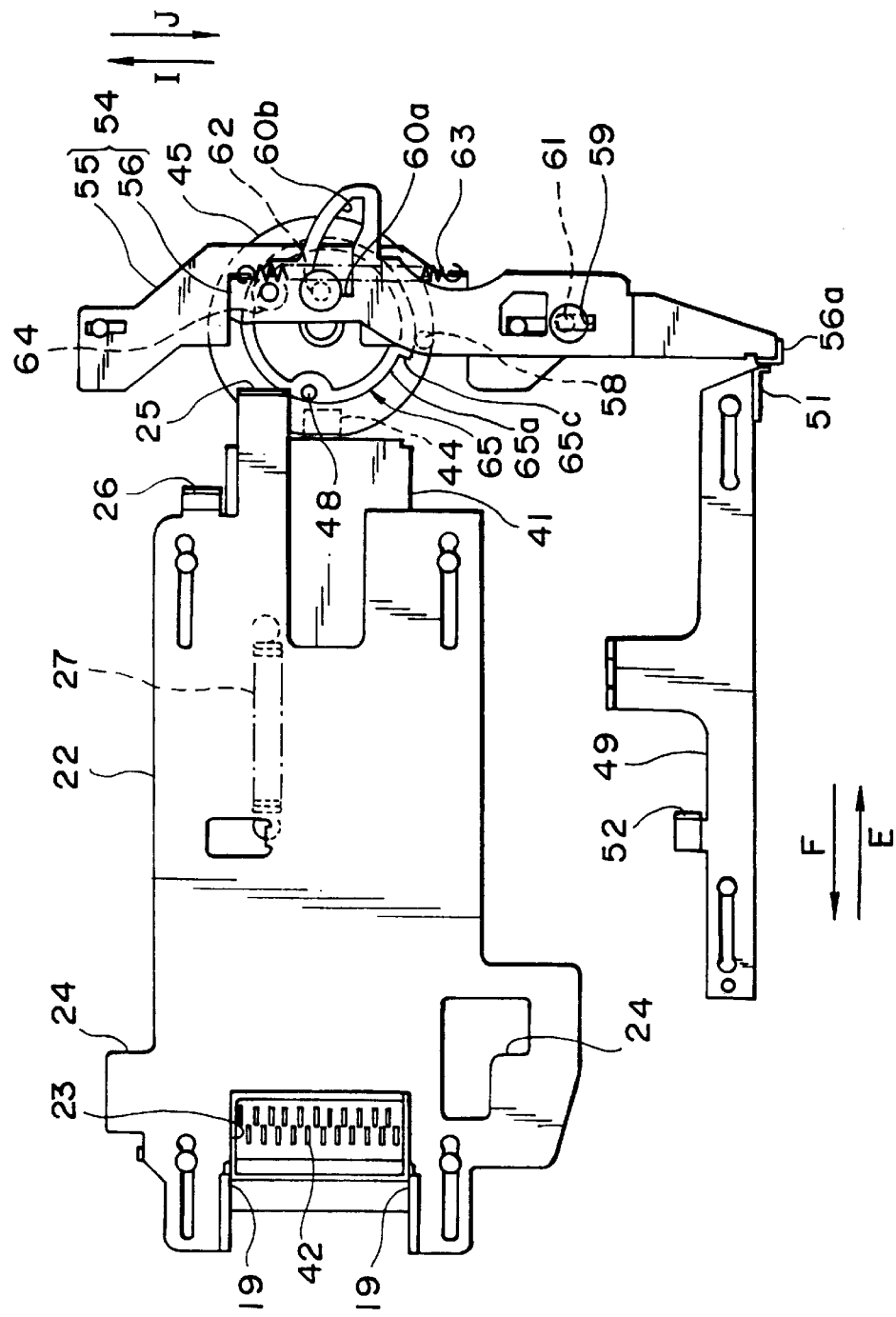
FIG. 17 is a plan view showing the relationship between the lock slider, the cam gear, the returning lever mechanism and the detachment slider when the lock slider is at the non-engagement position.

In the condition in which the disc player 1 is not placed on the placement surface 4, the cam gear 45 is at the initial position shown in FIGS. 11 and 17, and the roller 44 of the connector base 41 is in elastic contact with that portion of the bottom dead center portion 46a which is nearer to the rising portion 46b than the middle portion thereof. Thus, the left-hand end portion of the connector base 41 is at the lowest position, and the movable connector 42 is positioned under the connector protrusion hole 17.

When the disc player 1 is placed on the placement surface 4 and the lock slider 22 moves in the direction of the arrow E in FIGS. 11 and 17, that is, to the engagement position, the switch depression member 26 thereof is depressed against a position detecting switch 47 shown in FIG. 6 for detecting the position of the lock slider 22 and turns it on. When the position detecting switch 47 has been turned on, a system controller (not shown) determines that the lock slider 22 has reached the engagement position, and drives a motor (not shown) to rotate the cam gear 45.

Figure 18:
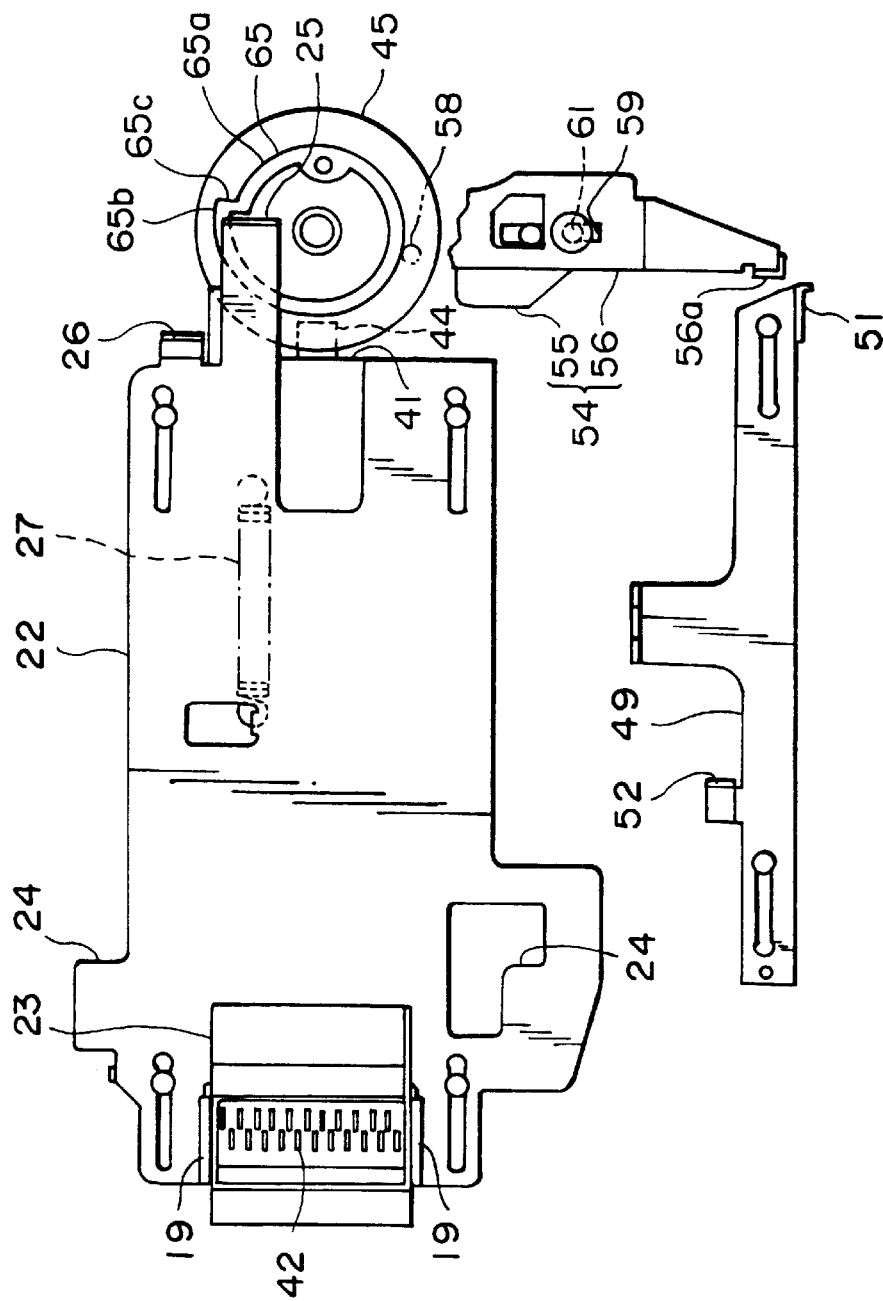
FIG. 18 is a plan view showing the relationship between the lock slider, the cam gear, the returning lever mechanism and the detachment slider when the lock slider is at the engagement position, with part of the lock slider being cut away.

When the cam gear 45 rotates and the roller 44 is brought into elastic contact with the rising portion 46b, the roller 44 is, from the position shown in FIG. 8, acutely decreased in height, as shown in FIG. 9, as it rolls on this rising portion 46b, so that the connector base 41 is rotated clockwise as seen from the front side in the direction indicated by the arrow H in FIG. 8, and the left-hand end portion thereof is rapidly raised, with the result that the movable connector 42 thereby supported protrudes upwards from the connector protrusion hole 17 to enter the disc player 1 through the opening 6 thereof. When the roller 44 has reached the counterclockwise rotation end of the press contact portion 46c, the movable connector 42 is, as shown in FIG. 15, brought into contact with the connector 7 for connection of the disc player 1 or into a state in which it is very close thereto. As shown in FIG. 18, while the roller 44 rolls on the press contact portion 46c to the clockwise rotation end thereof, the left-hand end portion of the connector base 41 is further raised, and the movable connector 42 thereby supported is brought into press contact with the connector 7 for connection. Here, the rotation of the cam gear 45 is stopped. In this condition, the attachment of the disc player 1 to the station adaptor 2 is completed. The position of the cam gear 45 at this time is the press contact position.

By thus bringing the movable connector 42 into press contact with the connector for connection 7, it is possible to obtain a stable press contact force for the movable connector 42 and the connector for connection 7.

When the detachment lever 20 is moved in the direction of the arrow E in FIG. 3, the motor (not shown) is driven again, and the cam gear 45 is rotated again. Immediately afterwards, the roller 44 of the connector base 41 relatively rolls on the lowering portion 46d of the vertical cam 46, and, in this while, the left-hand end portion of the connector base 41 is rapidly lowered in the direction of the arrow G in FIG. 8, the movable connector 42 supported there being detached from the disc player 1 to be moved further downwards from the connector protrusion hole 17.

As shown in FIGS. 10 and 11, a pressurizing protrusion 48 protrudes at a position of the upper surface of the cam gear 45 somewhat spaced apart in the direction of counterclockwise rotation from the counterclockwise rotation end of the rising portion 46b of the vertical cam 46, and immediately after the roller 44 reaches the counterclockwise rotation end of the bottom dead center portion 46a, the pressuring protrusion 48 starts to pressurize the portion to be pressurized 25 of the lock slider 22 in the direction of the arrow F in FIG. 10, whereby the lock slider 22 is moved in the direction of the arrow F against the tensile force due to the coil spring 27. When the cam gear 45 reaches the initial position shown in FIGS. 11 and 17, the lock slider 22 reaches the non-engagement position. When the cam gear 45 reaches the initial position, the motor (not shown) stops. When the lock slider 22 reaches the non-engagement position, the stoppers 30, which have been in slide contact with the lower surface of the lock slider 22 return to the lock positions due to the resilient force of the resilient portions 29a, and, as shown in FIG. 11, engage with the engagement edges 24 of the lock slider 22, so that the lock slider 22 is locked in the non-engagement position. In this condition, conversely to the case in which the disc player 1 is placed on the placement surface 4, the disc player 1 is raised in an inclined state starting with left-hand end portion thereof, whereby the disc player 1 can be detached from the station adaptor 2. In this process, the opening 6 on the lower side of the disc player 1 is closed by the cover 8.

As shown in FIGS. 7 and 8, at a position on the upper front surface of the chassis 21 somewhat to the left, a detachment slider 49 is supported so as to be movable in the directions indicated by the arrows E and F in FIG. 7, and the detachment lever 20 is fixed to the detachment slider 49. A tensile coil spring 50 is stretched between the detachment slider 49 and the chassis 21, whereby the detachment slider 49 is biased so as to move in the direction of the arrow F in FIG. 7.

A depression portion 51 is formed at the right-hand end of the detachment slider 49, and a downwardly protruding switch depression member 52 is formed in the middle portion of the detachment slider 49. When the detachment lever 20 is pressurized in the direction of the arrow E in FIG. 7, the detachment slider 49 is moved to the right, whereby the detachment switch 53 is depressed by the depression member 52 and turned on. When the detachment switch 53 is turned on, a motor (not shown) is driven and the cam gear 45 at the above-described depression position is rotated again, and the connector base 41 is rotated in the direction of the arrow G in FIG. 8, whereby the movable connector 42 is detached from the connector for connection 7 of the disc player 1.

Next, a function for detaching the disc player 1 from the station adaptor 2 when, in the condition in which the power source is not turned on, the disc player 1 is placed on the placement surface 4, will be described When the disc player 1 is placed on the placement surface 4 with the power source being off, the disc player 1 is locked on the placement surface 4, but, since the motor for driving the cam gear 45 is not driven, the connection of the movable connector 42 to the connector for connection 7 is not effected. Nor is the returning of the lock slider 22 to the non-engagement position by the rotation of the cam gear 45 is effected. Thus, unless some mechanism for cancelling such a condition is provided, the disc player 1 cannot be detached from the station adaptor 2. In such a case also, by moving the detachment lever 20 in the direction of the arrow E in FIG. 3, the disc player 1 can be detached from the station adaptor 2.

For this purpose, as shown in FIGS. 7 and 9 and FIGS. 17 to 19, a return lever mechanism 54 is provided. The return lever mechanism 54 includes a base slider 55 and a rotating lever 56 supported by the base slider 55. The base slider 55 is formed as a substantially longitudinally elongated plate, which is supported on the upper surface of the chassis 21 so as to be longitudinally movable. A coil spring 57 is stretched between the base slider 55 and the chassis 21, whereby the base slider 55 is biased in the direction indicated by the arrow I in FIGS. 7 and 17. As shown in FIG. 8, a pin 58 protrudes downwards from the middle portion of the slider 55.

The rotating lever 56 is supported on the upper surface of the base slider 55 so as to be movable in the directions of the arrows I and J in FIGS. 7 and 17 and rotatable. A longitudinally elongated hole 59 is formed at a position near the forward end of the rotating lever 56, and an arcuate slit 60 is formed at a position near the rear end thereof. The length of the left-hand side edge 60a of the slit 60 is substantially the same as the length of the elongated hole 59, and the rear-side edge 60b is formed in an arcuate configuration whose center is the rear end portion of the elongated hole 59. A shaft 61 protruding upright from the front end portion of the base slider 55 is slidably inserted into the elongated hole 59 of the rotating lever 56, and a shaft 62 protruding upright from substantially the middle portion of the base slider 55 is inserted into the arcuate slit 60 of the rotating lever 56. A coil spring 63 is stretched between the base slider 55 and the rotating lever 56, whereby the rotating lever 56 is biased so as to move in the direction of the arrow I in FIG. 17 with respect to the base slider 55, and to rotate counterclockwise as seen from above around the engagement section of the shaft 61 and the elongated hole 59. Thus, the left-hand side edge 60a is in contact with the shaft 62 of the base slider 55.

As shown in FIGS. 8 and 9, a depression pin 64 is provided so as to extend vertically at the rear end of the rotating lever 56, and this depression pin 64 is opposed to the portion to be depressed 25 of the lock slider 22 at the non-engagement position so as to be spaced apart therefrom from the right-hand side.

As shown in FIGS. 6, 10, 18 and 19, a cylindrical cam 65 having a substantially cylindrical configuration is formed on the upper surface of the cam gear 45, and the outer peripheral surface thereof constitutes the cam surface, the pin 58 of the return lever 54 being held in elastic contact with the cam surface from the front side. The cam surface of the cylindrical cam 65 has an arcuate non-variation portion 65a which is formed in an angular range somewhat smaller than 270° and which is at a fixed distance from the center and a variation portion 65b which is formed in an angular range somewhat larger than 90° and whose distance from the center increases as it moves clockwise. The counterclockwise end of the variation portion 65b is continuously connected to the non-variation portion 65a, and the distance of the clockwise rotation end from the center of the cam gear 45 is larger than that of the non-variation portion 65a, whereby a step portion 65c is formed between the clockwise rotation end of the variation portion 65b and the counterclockwise rotation end of the non-variation portion 65a. The step portion 65c is formed at a position spaced apart clockwise from the clockwise rotation end of the lowering portion 46d of the vertical cam 46 by an angular range of approximately 30°. Thus, in the condition in which the cam gear 45 is at the initial position, the pin 58 of the return lever 54 is in elastic contact with the portion of the variation portion 65b which is spaced apart counterclockwise from the step portion 65c by an angular range of approximately 30°. In this condition, the return lever 54 is positioned in the vicinity of the forward end of the range of movement thereof, and the forward end portion 56a of the rotating lever 56 is positioned immediately to the right of the depressing portion 51 of the detachment slider 49.

Figure 19:
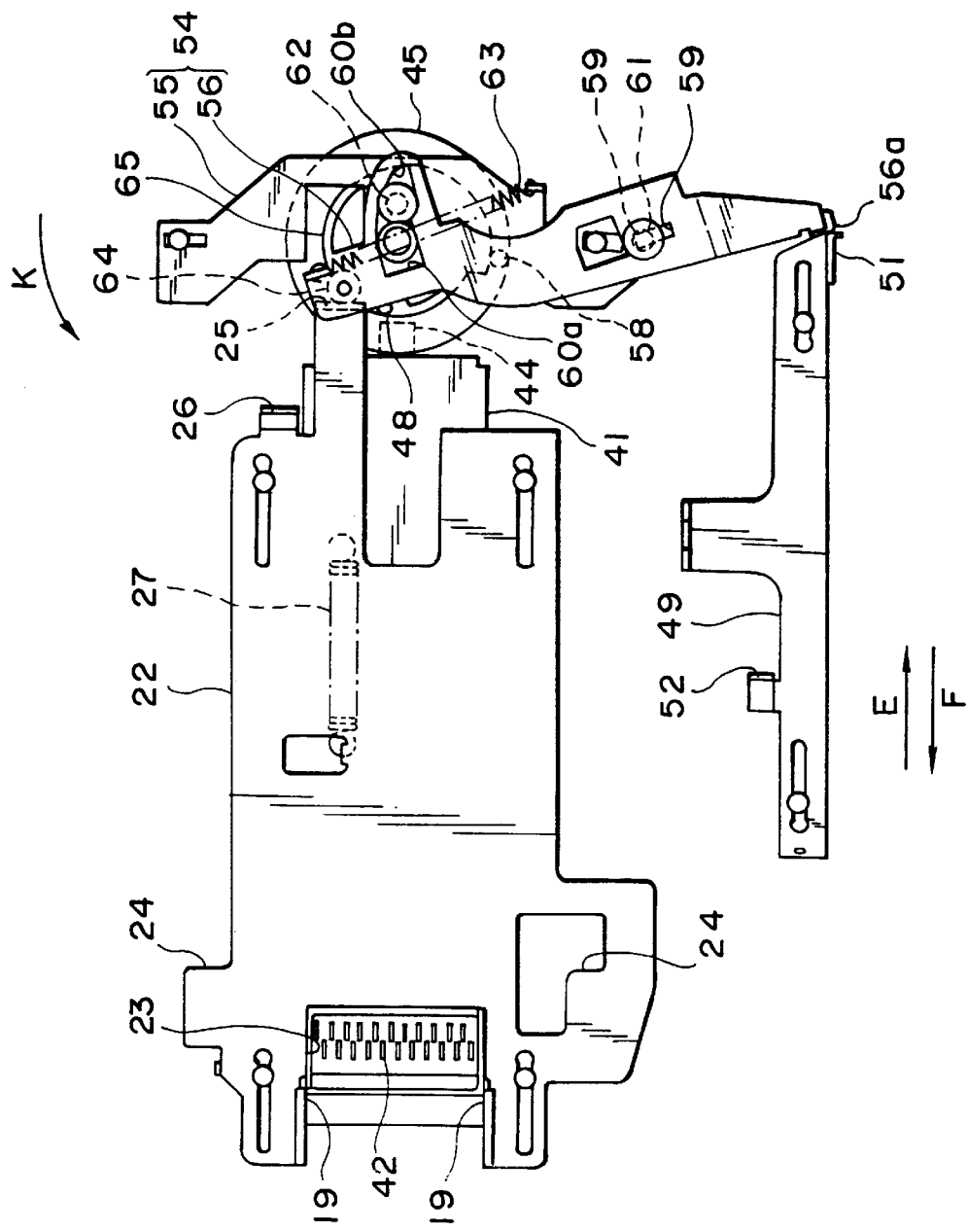
FIG. 19 is a plan view showing the state in which the rotation lever of the returning lever mechanism is being rotated by the detachment slider.

When, in the condition in which the power source is off, the disc player 1 is placed on the placement surface 4 and the lock slider 22 moves to the engagement position, the member to be depressed 25 thereof is positioned immediately to the left of the depression pin 64 of the return lever 54. Thus, when the detachment lever 20 is moved in the direction of the arrow E in FIG. 3, the detachment slider 49 is thereby moved in the direction of the arrow E in FIG. 19, and the depressing portion 51 thereof pressurizes the forward end portion 56a of the rotating lever 56 in the direction of the arrow E in FIG. 19, whereby the rotating lever 56 rotates counterclockwise, i.e., in the direction of the arrow K in FIG. 19, as seen from above around the portion of the elongated hole 59 engaged with the shaft 61, so that the depression pin 64 provided at the rear end thereof moves substantially in the direction of the arrow F in FIG. 19. When the depression pin 64 moves to the left, the depression pin 64 pressurizes the member to be depressed 25 of the lock slider 22 in the direction of the arrow F in FIG. 19 as shown in FIG. 19, whereby the lock slider 22 is moved in the direction of the arrow F, that is, toward the non-engagement position. When it has reached the non-engagement position, the stoppers 30 are engaged with the engagement edges 24 thereof, so that it is locked in the non-engagement position. As a result, it is possible to detach the disc player 1 from the station adaptor 2 in the same manner as described above.

On the other hand, when, in the condition in which the power source is on, the disc player 1 is placed on the placement surface 4, the lock slider 22 moves to the engagement position to thereby rotate the cam gear 45, so that the pin 58 of the return lever mechanism 54 is separated from the clockwise rotation end of the variation portion 65b of the cylindrical cam 65 and brought into elastic contact with the non-variation portion 65a. Thus, the return lever mechanism 54 moves in the direction of the arrow I in FIG. 19 by the biasing moving force applied thereto, and the forward end portion 56a of the rotating lever 56 is at a retracted position reached by moving in the direction of the arrow I from the right-hand position of the depressing portion 51 of the detachment slider 49. Thus, if in this condition the slider 49 moves in the direction of the arrow E in FIG. 7, the depressing portion 51 thereof does not pressurize the forward end portion 56a of the rotating lever 56, missing, as it were, its object.

When the detachment slider 49 is moved in the direction of the arrow E in FIG. 7, and the cam gear 45 is rotated again, the movable connector 42 returns to the non-connection position, and the pin 58 is pressurized in the direction of the arrow J in FIG. 19 by the variation portion 65b of the cylindrical cam, whereby the return lever 54 moves in the direction of the arrow J, and the forward end portion 56a of the rotating lever 56 is, as shown, for example, in FIG. 17, positioned to the right of the depressing portion 51 of the detachment slider 49.

While the above embodiment has been described with respect to the case in which the portable electronic apparatus consists of a portable type recording and/or reproducing apparatus, the present invention is also applicable to a recording and/or reproducing apparatus using a magnetic tape as the recording medium or a storage (recording) and/or reproducing apparatus using a semiconductor memory as the recording medium.

It goes without saying that the present invention is not restricted to the above-described embodiment, and that various modifications are possible without departing from the spirit and scope of the invention.

What is claimed is:

1. An auxiliary device for an electronic apparatus comprising:
   an attachment section for attaching to the electronic apparatus;
   first and second detection mechanisms operated by the electronic apparatus attached to said attachment section; and
   a holding mechanism for holding the electronic apparatus attached to said attachment section, wherein said holding mechanism holds the electronic apparatus when said first and second detection mechanisms are operated by the electronic apparatus attached to said attachment section,
   wherein said first detection mechanism is equipped with a first operating section operated by the electronic apparatus attached to said attachment section, and wherein said second detection mechanism is equipped with a second operating section adapted to protrude from and retract into said attachment section, and wherein said second operating section retracts into said attachment section by operation of said first operating section by the electronic apparatus attached to said attachment section.

2. The auxiliary device for an electronic apparatus according to claim 1, wherein said holding mechanism is equipped with an engagement section for engaging with an engagement portion of the electronic apparatus attached to said attachment section, wherein said engagement section is engaged with said engagement portion after being retracted into said attachment section by the operation of said first operating section by the electronic apparatus attached to said attachment section.

3. The auxiliary device for an electronic apparatus according to claim 2, wherein said first detection mechanism includes a restricting section for restricting a retraction movement of said second operating section into said attachment section, and wherein said restricting section cancels the restriction of said retraction movement when said first operating section is operated by the electronic apparatus attached to said attachment section.

4. The auxiliary device for an electronic apparatus according to claim 3, wherein said second detection mechanism includes a preventing section for preventing said engagement section from being engaged with said engagement portion of the electronic apparatus attached to said attachment section, and wherein said preventing section engages said engagement section with said engagement portion when the restriction of said retraction movement of said second operating section is cancelled.

5. The auxiliary device for an electronic apparatus according to claim 1, further comprising a cancelling mechanism for cancelling a holding operation of said holding mechanism when no power is being supplied to the auxiliary device.

6. The auxiliary device for an electronic apparatus according to claim 6, wherein said holding mechanism includes an engagement section for engaging with an engagement portion of the electronic apparatus attached to said attachment section, wherein said engagement section is engaged with said engagement portion after being retracted into said attachment section by the operation of said first operating section by the electronic apparatus attached to said attachment section.

7. The auxiliary device for an electronic apparatus according to claim 6, wherein said cancelling mechanism moves said engagement section to cancel engagement with said engagement portion of the electronic apparatus attached to said attachment section.

8. The auxiliary device for an electronic apparatus according to claim 7, wherein said cancelling mechanism includes:
   a detachment operation section for detaching the electronic apparatus from said attachment section; and
   a cancelling lever engaged with said detachment operation section for moving said engagement section to cancel its engagement with said engagement portion by operating said detachment operation section.

9. The auxiliary device for an electronic apparatus according to claim 8, wherein said cancelling mechanism is formed such that when said power is being supplied the engagement of said detachment operation section with said cancelling lever is cancelled.

10. The auxiliary device for an electronic apparatus according to claim 1, further comprising:
   a connection mechanism connected to the electronic apparatus attached to said attachment section; and a movement mechanism for moving said connection mechanism between a first position where it is connected to the electronic apparatus attached to said attachment section and a second position where it is detached from the electronic apparatus.

11. The auxiliary device for an electronic apparatus according to claim 10, wherein said movement mechanism includes a cam member for moving said connection mechanism between said first position where it is connected to the electronic apparatus attached to said attachment section and said second position where it is detached from the electronic apparatus, and wherein the operation of said holding mechanism for holding the electronic apparatus attached to said attachment section is cancelled by said cam member.

12. An Auxiliary device for an electronic apparatus having a connection terminal, said auxiliary device comprising:
    an attachment section for attaching to the electronic apparatus;
    first and second detection mechanisms operated by the electronic apparatus attached to said attachment section;
    a holding mechanism for holding the electronic apparatus attached to said attachment section, wherein said holding mechanism holds the electronic apparatus when said first and second detection mechanisms are operated by the electronic apparatus attached to said attachment section;
    an input/output section connected to the connection terminal of the electronic apparatus held by the holding mechanism for performing an exchange of signals; and
    a movement mechanism for moving said input/output section between a first position where it is connected to the connection terminal and a second position where it is separated from the connection terminal,
    wherein said movement mechanism moves said input/output section from said first position to said second position and cancels an operation of said holding mechanism for holding the electronic apparatus attached to said attachment section, and
    wherein said first detection mechanism is equipped with a first operating section operated by the electronic apparatus attached to said attachment section, and wherein said second detection mechanism is equipped with a second operating section adapted to protrude from and retract into said attachment section, and wherein said second operating section retracts into said attachment section by operation of said first operating section by the electronic apparatus attached to said attachment section.

13. The auxiliary device for an electronic apparatus according to claim 12, wherein said holding mechanism is equipped with an engagement section for engaging with an engagement portion of the electronic apparatus attached to said attachment section, wherein said engagement section is engaged with said engagement portion after being retracted into said attachment section by the operation of said first operating section by the electronic apparatus attached to said attachment section.

14. The auxiliary device for an electronic apparatus according to claim 13, wherein said first detection mechanism includes a restricting section for restricting a retraction movement of said second operating section into said attachment section, and wherein said restricting section cancels restriction of said retraction movement when said first operating section is operated by the electronic apparatus attached to said attachment section.

15. The auxiliary device for an electronic apparatus according to claim 14, wherein said second detection mechanism includes a preventing section for preventing said engagement section from being engaged with said engagement portion of the electronic apparatus attached to said attachment section, and wherein said preventing section engages said engagement section with said engagement portion when the restriction of said retraction movement of said second operating section is cancelled.

16. The auxiliary device for an electronic apparatus according to claim 12, wherein said movement mechanism includes:
    a first cam section for moving said input/output section between said first and said second positions; and
    a second cam section for cancelling operation of said holding mechanism for holding the electronic apparatus attached to said attachment section.

17. The auxiliary device for an electronic apparatus according to claim 12, further comprising a cancelling mechanism for cancelling operation of said holding mechanism for holding the electronic apparatus attached to said attachment section when no power is being supplied to the auxiliary device.

18. The auxiliary device for an electronic apparatus according to claim 17, wherein said holding mechanism includes an engagement section for engaging with an engagement portion of the electronic apparatus attached to said attachment section, wherein said engagement section is engaged with said engagement portion after being retracted into said attachment section by operation of said first operating section by the electronic apparatus attached to said attachment section.

19. The auxiliary device for an electronic apparatus according to claim 18, wherein said cancelling mechanism moves said engagement section to cancel engagement thereof with said engagement portion of the electronic apparatus attached to said attachment section.

20. The auxiliary device for an electronic apparatus according to claim 19, wherein said cancelling mechanism includes:
    a detachment operation section for detaching the electronic apparatus from the auxiliary device; and
    a cancelling lever engaged with said detachment operation section for moving said engagement section to cancel engagement thereof with said engagement portion by operating said detachment operation section.

21. The auxiliary device for an electronic apparatus according to claim 20, wherein said cancelling mechanism is formed such that when said power is being supplied the engagement of said detachment operation section with said cancelling lever is cancelled.

* * * * *